United States Patent
Itasaka et al.

(10) Patent No.: US 11,115,029 B2
(45) Date of Patent: Sep. 7, 2021

(54) INTEGRATED CIRCUIT DEVICE, OSCILLATOR, ELECTRONIC APPARATUS, AND VEHICLE

(71) Applicant: Seiko Epson Corporation, Tokyo (JP)

(72) Inventors: Yosuke Itasaka, Minowa (JP); Naoki Il, Suwa (JP); Takashi Nomiya, Matsumoto (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/918,083

(22) Filed: Jul. 1, 2020

(65) Prior Publication Data

US 2021/0006251 A1 Jan. 7, 2021

(30) Foreign Application Priority Data

Jul. 2, 2019 (JP) .............. JP2019-123442

(51) Int. Cl.
*H03B 5/04* (2006.01)
*H05K 1/02* (2006.01)
*H03L 1/04* (2006.01)

(52) U.S. Cl.
CPC .............. *H03L 1/04* (2013.01); *H03B 5/04* (2013.01); *H05K 1/0201* (2013.01)

(58) Field of Classification Search
CPC ................ H03B 5/04; H05K 1/0201
USPC ........................... 331/66, 176, 158
See application file for complete search history.

(56) References Cited

U.S. PATENT DOCUMENTS

| 2005/0082377 A1* | 4/2005 | Kato ............... G05D 23/19 236/72 |
| 2007/0057742 A1* | 3/2007 | Mitome ............ H03B 5/04 331/158 |
| 2008/0224786 A1* | 9/2008 | Stolpman .......... H03B 5/36 331/66 |
| 2016/0218718 A1 | 7/2016 | Yamamoto |
| 2016/0218719 A1 | 7/2016 | Yamamoto |

FOREIGN PATENT DOCUMENTS

| JP | 2016-134888 A | 7/2016 |
| JP | 2016-134889 A | 7/2016 |

\* cited by examiner

*Primary Examiner* — Joseph Chang
(74) *Attorney, Agent, or Firm* — Harness, Dickey & Pierce, P.L.C.

(57) ABSTRACT

An integrated circuit device includes a temperature sensor, a heat generation source circuit serving as a heat generation source, a pad for external coupling, and a capacitor having the MIM structure in which one electrode is electrically coupled to the pad for external coupling. In a plan view orthogonal to the substrate on which a circuit element is formed, the capacitor having the MIM structure and the temperature sensor overlap.

15 Claims, 19 Drawing Sheets

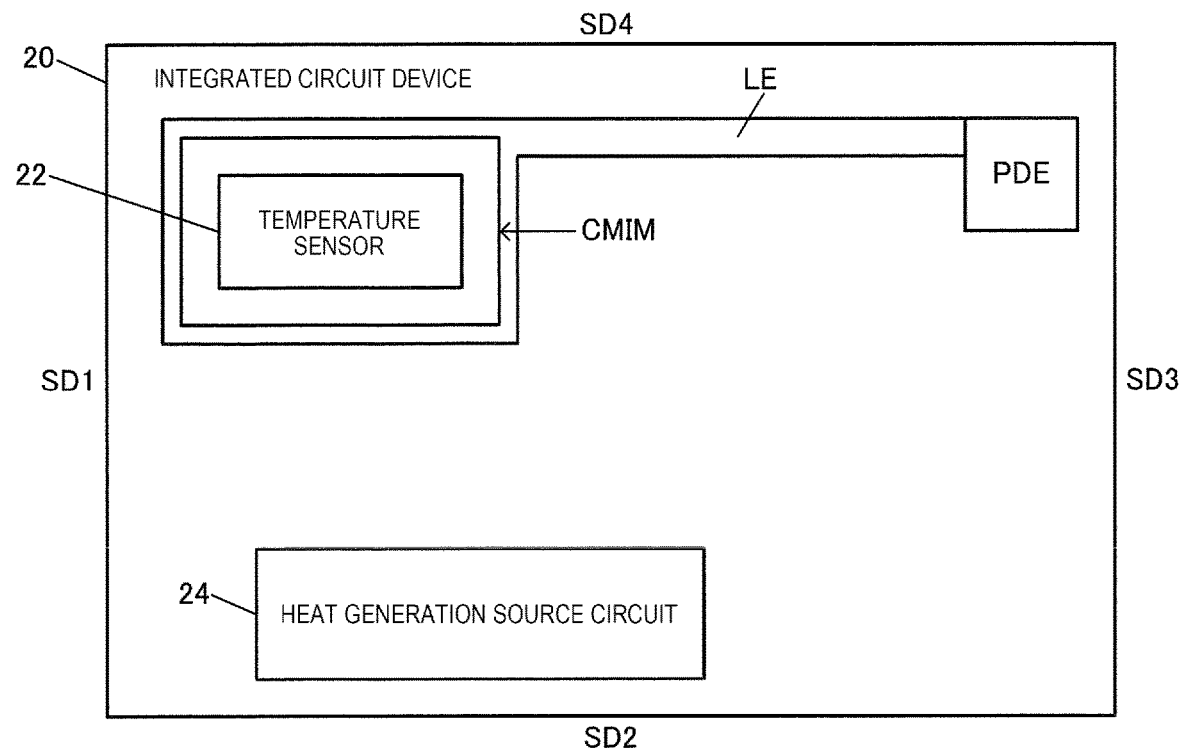
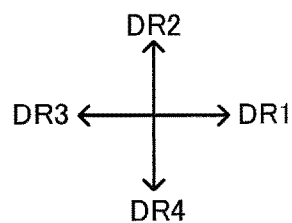

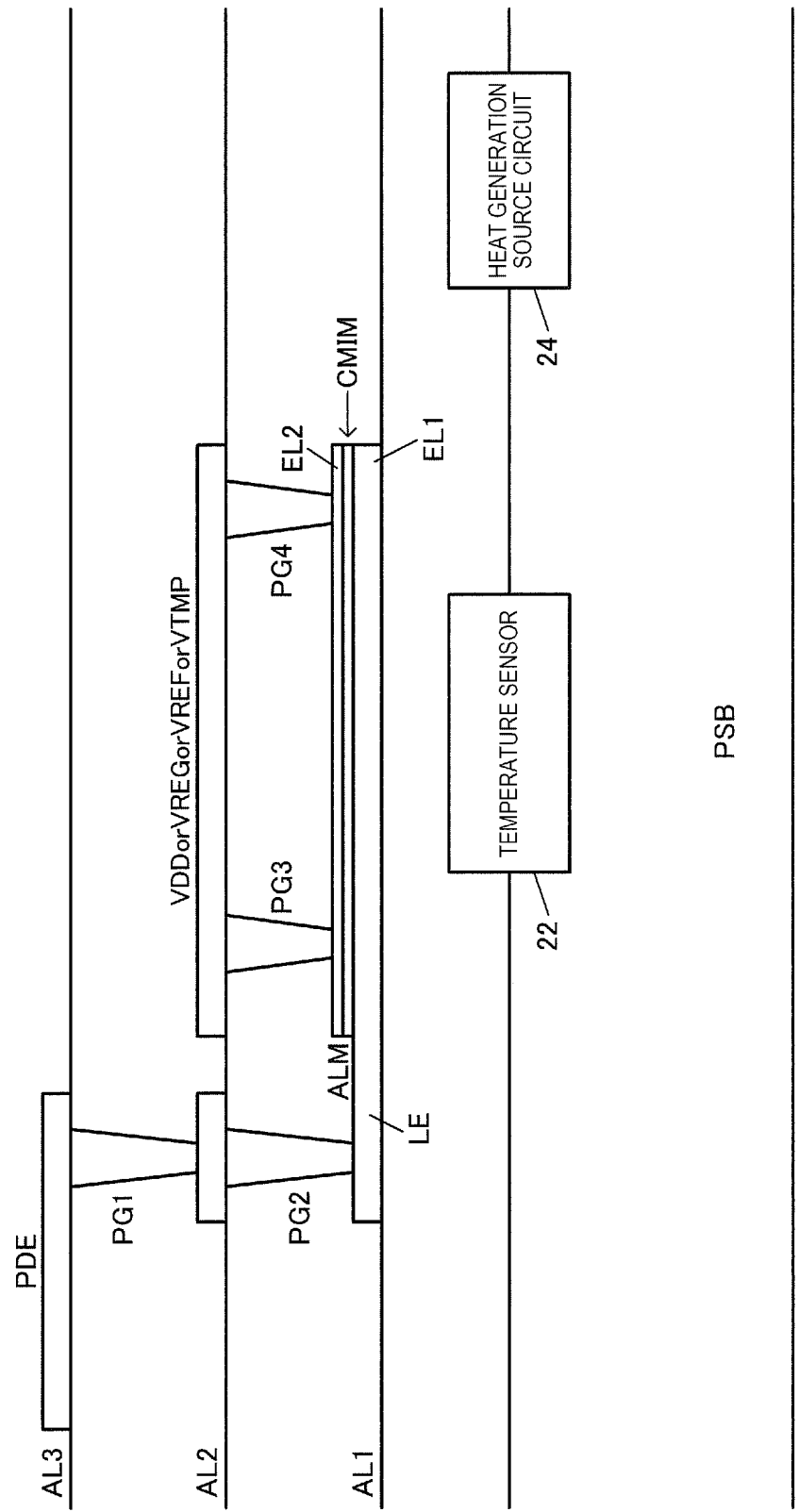

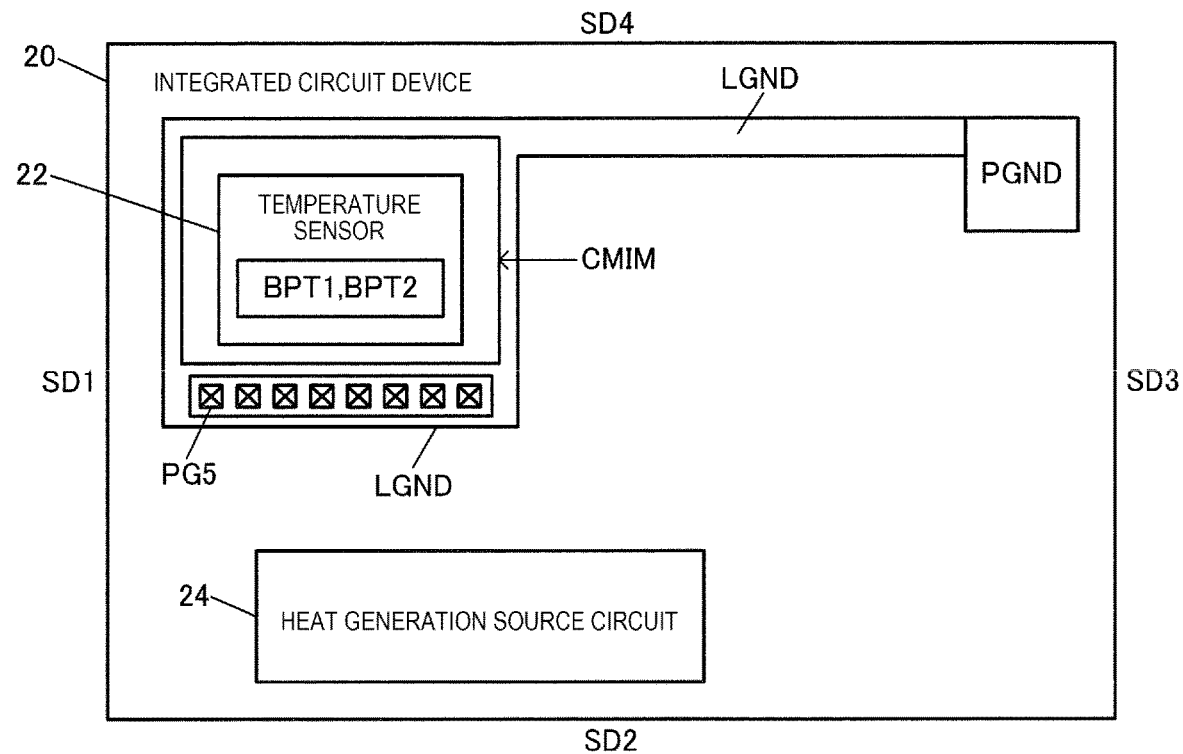
FIG. 3
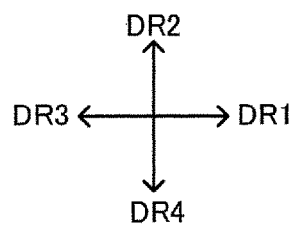

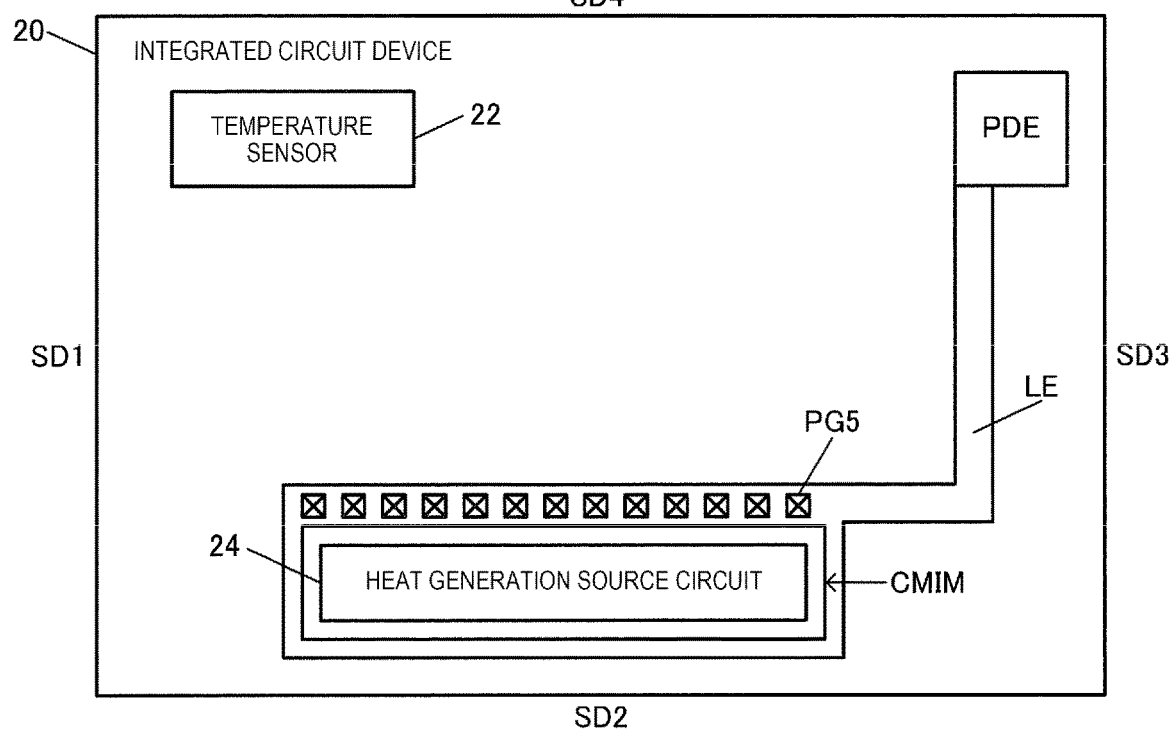
FIG. 8
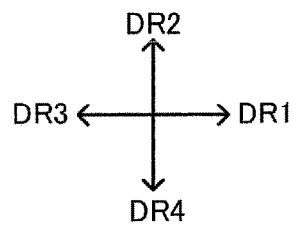

INTEGRATED CIRCUIT DEVICE, OSCILLATOR, ELECTRONIC APPARATUS, AND VEHICLE

The present application is based on, and claims priority from JP Application Serial Number 2019-123442, filed Jul. 2, 2019, the disclosure of which is here by incorporated by reference here in its entirety.

BACKGROUND

1. Technical Field

The present disclosure relates to an integrated circuit device, an oscillator, an electronic apparatus, a vehicle, and the like.

2. Related Art

JP-A-2016-134888 discloses a technology as a related art of an integrated circuit device in which a temperature sensor is mounted. In JP-A-2016-134888, by disposing a wiring coupled to an output circuit as a heat generation source circuit and a temperature sensor so as to overlap in a plan view, the temperature near the output circuit is accurately detected, and the output frequency is stabilized.

In an integrated circuit device having a temperature sensor and a heat generation source circuit as disclosed in JP-A-2016-134888, it is desirable that the heat from the heat generation source circuit does not greatly affect the temperature sensor. Further, there is a demand for a reduction in the area of the integrated circuit device in order to reduce the size and cost of the device in which the integrated circuit device is mounted.

SUMMARY

An aspect of the present disclosure relates to an integrated circuit device including: a temperature sensor; a heat generation source circuit serving as a heat generation source; a pad for external coupling; and a capacitor having the MIM structure in which one electrode is electrically coupled to the pad for external coupling, in which the capacitor having the MIM structure and the temperature sensor overlap in a plan view orthogonal to a substrate on which a circuit element is formed.

BRIEF DESCRIPTION OF THE DRAWINGS

FIG. 1 is a disposal example of an integrated circuit device.

FIG. 2 is an example of a cross-sectional structure of the integrated circuit device.

FIG. 3 is a detailed first disposal example of the integrated circuit device.

FIG. 8 is a detailed second disposal example of the integrated circuit device.

DESCRIPTION OF EXEMPLARY EMBODIMENTS

Figure 4:
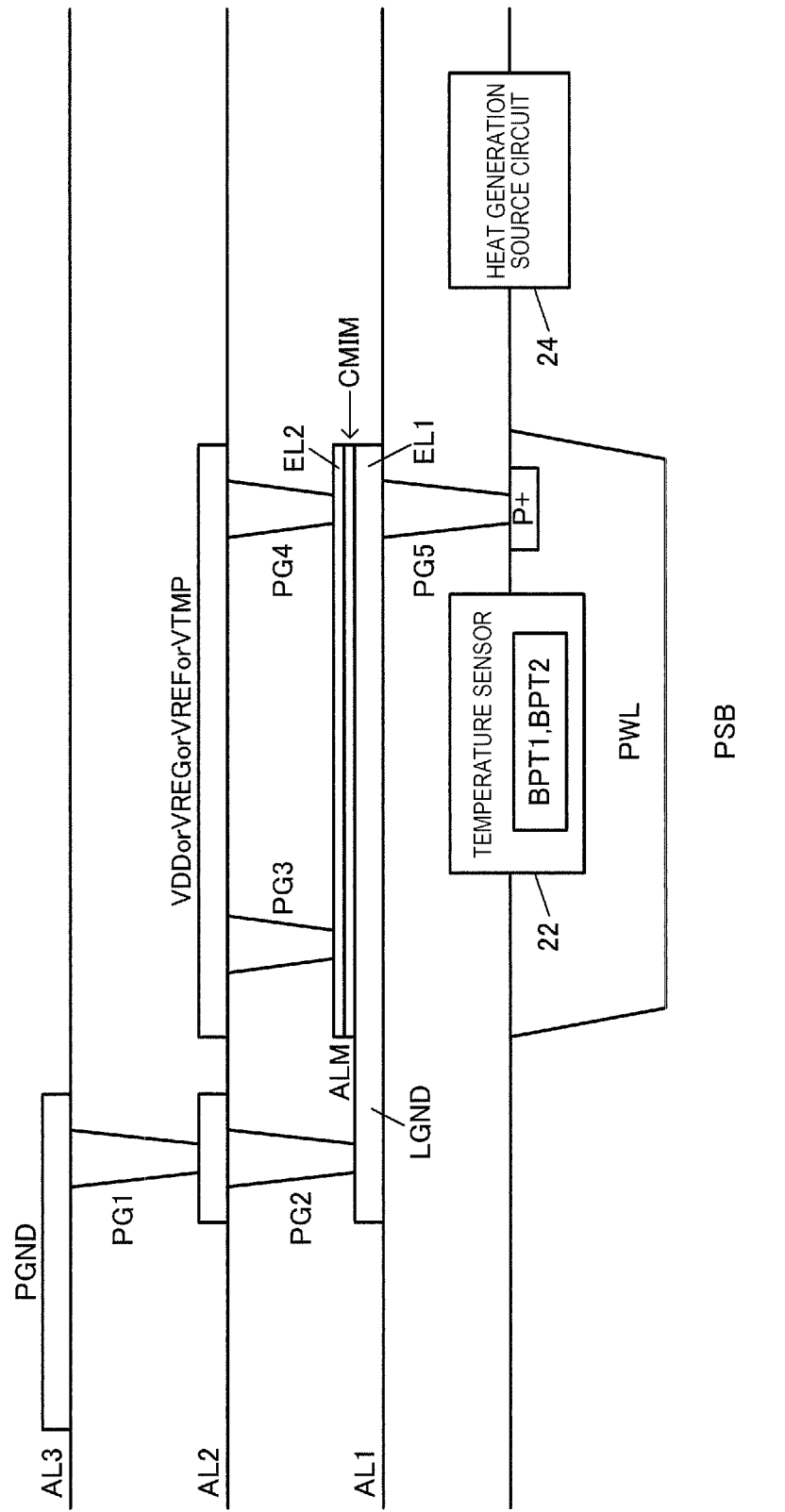
FIG. 4 is an example of a cross-sectional structure of the integrated circuit device in the first disposal example.

Hereinafter, the present embodiment will be described. The present embodiment described below does not unduly limit the contents of the appended claims. Further, not all of the configurations described in the present embodiment are essential configuration requirements.

1. Integrated Circuit Device

FIG. 1 shows a disposal example of an integrated circuit device 20 of the present embodiment. The integrated circuit device 20 of the present embodiment includes a temperature sensor 22, a heat generation source circuit 24, a pad PDE for external coupling, and a capacitor CMIM having a metal-insulator-metal (MIM) structure.

The integrated circuit device 20 has sides SD1, SD2, SD3, and SD4. The sides SD1, SD2, SD3, and SD4 are a first side, a second side, a third side, and a fourth side, respectively. The sides SD1, SD2, SD3, and SD4 correspond to sides of a rectangular semiconductor chip that is the integrated circuit device 20. For example, the sides SD1, SD2, SD3, and SD4 are sides of the semiconductor chip substrate. The semiconductor chip is also called a silicon die. The side SD2 is a side that intersects the side SD1. Here, the intersection is orthogonal, for example. The side SD3 is the opposite side of the side SD1. The side SD4 is the opposite side of the side SD2. The side SD1 and the side SD3 intersect with the side SD2 and the side SD4. Here, the direction from the side SD1 to the side SD3 is DR1, and the direction from the side SD2 to the side SD4 is DR2. The direction opposite to the direction DR1 is defined as a direction DR3, and the direction opposite to the direction DR2 is defined as a direction DR4. The directions DR1, DR2, DR3, and DR4 are a first direction, a second direction, a third direction, and a fourth direction, respectively.

The temperature sensor 22 is a sensor circuit for detecting a temperature. Specifically, as will be described later with reference to FIGS. 15 and 16, the temperature sensor 22 outputs a temperature-dependent voltage that changes according to the temperature of the environment as a temperature detection voltage VTMP. For example, the temperature sensor 22 generates the temperature detection voltage VTMP using a circuit element having temperature dependency. Specifically, the temperature sensor 22 uses the temperature dependency of the forward voltage of the PN junction to output a temperature detection voltage VTMP whose voltage value changes depending on the temperature. As the forward voltage of the PN junction, for example, the base-emitter voltage of a bipolar transistor can be used.

The heat generation source circuit 24 is a circuit serving as a heat generation source, and is a circuit that generates heat by circuit operation. The heat generation source circuit 24 is a circuit serving as a main heat generation source among a plurality of circuit blocks included in the integrated circuit device 20, and is, for example, a circuit that generates the largest amount of heat or a circuit that generates the largest amount of heat after the circuit.

The pad PDE for external coupling is a pad for electrically coupling to an external device or external wiring of the integrated circuit device 20. The pad is a terminal of the integrated circuit device 20. For example, in the pad region, a metal layer is exposed from a passivation film which is an insulating layer. For example, the exposed metal layer forms a pad.

A capacitor CMIM having the MIM structure is a capacitor having a structure in which an insulating layer is sandwiched between two metal electrodes. The capacitor CMIM having the MIM structure is a thin film capacitor that can obtain a large capacitance with a small area, and can realize a high capacitance density. In FIG. 1, the capacitor CMIM having the MIM structure has one electrode electrically coupled to the pad PDE for external coupling. Specifically, the capacitor CMIM and the pad PDE for external coupling are electrically coupled via a coupling line LE. When the pad PDE for external coupling is a ground pad, the coupling line LE is a ground line, and when the pad PDE for external coupling is a power supply pad, the coupling line LE is a power supply line.

In the present embodiment, as shown in FIG. 1, the capacitor CMIM having the MIM structure and the temperature sensor 22 overlap in a plan view orthogonal to the substrate on which the circuit element is formed. The substrate on which the circuit element is formed is the substrate of the integrated circuit device 20, for example, a semiconductor substrate. At the substrate of the integrated circuit device 20, an active element such as a transistor and a passive element such as a resistor and a capacitor are formed as a circuit element. The capacitor CMIM having the MIM structure is disposed so as to overlap the temperature sensor 22 in a plan view in which the direction orthogonal to the substrate of the integrated circuit device 20 is the sight direction. For example, the capacitor CMIM having the MIM structure is disposed so as to at least partially overlap the temperature sensor 22. For example, at least half or more of the entire area of the capacitor CMIM is disposed so as to overlap the temperature sensor 22. The direction in a plan view which is a direction orthogonal to the substrate is a direction orthogonal to the directions DR1 and DR2.

FIG. 2 shows an example of a cross-sectional structure of the integrated circuit device 20. A metal layer AL1 is an upper metal layer of a metal layer AL2. A metal layer AL3 is an upper metal layer of the metal layer AL2, and is also called a pad metal layer for forming pads and pad wiring. The metal layer AL1 is formed, for example, above a P-type substrate PSB with an insulating layer interposed therebetween, the metal layer AL2 is formed above the metal layer AL1 with an insulating layer interposed therebetween, and the metal layer AL3 is formed above the metal layer AL2 with an insulating layer interposed therebetween. Here, the upper direction is the direction from the substrate PSB to the circuit element on the substrate PSB. The metal layers AL1, AL2, and AL3 are formed of, for example, aluminum or an aluminum alloy. In the present embodiment, a case where the multilayer metal layer is a three-layer metal layer will be mainly described as an example, but four or more metal layers may be used.

The pad PDE for external coupling formed by the metal layer AL3 is electrically coupled to the coupling line LE via metal plugs PG1 and PG2 as via plugs. The coupling line LE is formed by, for example, the lowermost metal layer AL1. The metal plugs PG1 and PG2, which are via plugs, are plugs formed in via holes for electrically coupling metal layers.

As shown in FIG. 2, the capacitor CMIM having the MIM structure is disposed above the temperature sensor 22. By disposing the capacitor CMIM having the MIM structure in this manner, the capacitor CMIM and the temperature sensor 22 are disposed to overlap with each other in a plan view in a direction orthogonal to the substrate PSB as shown in FIG. 1. On the other hand, the heat generation source circuit 24 is disposed at a position away from the temperature sensor 22 in a direction parallel to the substrate PSB. For example, the temperature sensor 22 is disposed below the capacitor CMIM, but the heat generation source circuit 24 is disposed at a different place from the position below the capacitor CMIM.

The capacitor CMIM having the MIM structure is composed of an electrode EL1 formed by the metal layer AL1, an electrode EL2 formed by a MIM metal layer ALM, and an insulating layer provided between the electrodes EL1 and EL2. The electrode EL1 is one electrode of the capacitor CMIM, and the electrode EL2 is the other electrode of the capacitor CMIM. The MIM metal layer ALM is a metal layer formed between the two metal layers AL1 and AL2 to form an electrode of the capacitor CMIM having the MIM structure, and is formed of, for example, aluminum or an aluminum alloy. The electrode EL1, which is one electrode of the capacitor CMIM, is electrically coupled to the pad PDE for external coupling. On the other hand, a power supply voltage VDD, a regulated voltage VREG, a reference voltage VREF, a temperature detection voltage VTMP of the temperature sensor 22, and the like are supplied to the electrode EL2, which is the other electrode of the capacitor CMIM, as described later. For example, a voltage of VDD, VREG, VREF or VTMP is supplied to a wiring formed by the metal layer AL2, and the wiring is electrically coupled to the electrode EL2 of the capacitor CMIM via the metal plugs PG3 and PG4, so that the voltage is supplied to the electrode EL2.

FIG. 3 shows a detailed first disposal example of the integrated circuit device 20, and FIG. 4 shows a cross-sectional structure example of the integrated circuit device 20 in the first disposal example. In FIGS. 3 and 4, a ground pad PGND is provided as the pad PDE for external coupling. Then, the ground voltage from the ground pad PGND is supplied to one electrode EL1 of the capacitor CMIM having the MIM structure via the ground line LGND. For example, a ground voltage from the ground pad PGND is supplied to one electrode EL1 of the capacitor CMIM via the metal plugs PG1, PG2 and the ground line LGND. Further, the voltage of VDD, VREG, VREF or VTMP is supplied to the other electrode EL2 of the capacitor CMIM via the wiring formed by the metal layer AL2 and the metal plugs PG3 and PG4.

In FIGS. 3 and 4, the ground line LGND is electrically coupled to the substrate PSB via a metal plug PG5 as a contact plug. The metal plug PG5, which is a contact plug, is a plug formed in a contact hole for electrically coupling a metal layer to a diffusion layer or a substrate. For example, a P-type well PWL is formed in the P-type substrate PSB, and a P+ diffusion region, which is a P-type impurity region, is formed in the well PWL. The ground line LGND is electrically coupled to the P-type substrate PSB via the metal plug PG5, the P+ diffusion region, and the P-type well PWL. As a result, the substrate PSB is set to the ground voltage.

In FIGS. 3 and 4, the ground voltage is supplied to one electrode EL1 of the capacitor CMIM, and the voltage of VDD, VREG, VREF or VTMP is supplied to the other electrode EL2. This makes it possible to use the capacitor CMIM having the MIM structure as a stabilizing capacitance for the voltage of VDD, VREG, VREF or VTMP.

Figure 15:
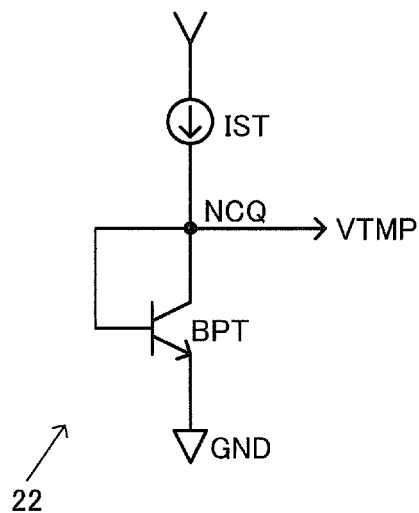
FIG. 15 is a first configuration example of the temperature sensor.
Figure 16:
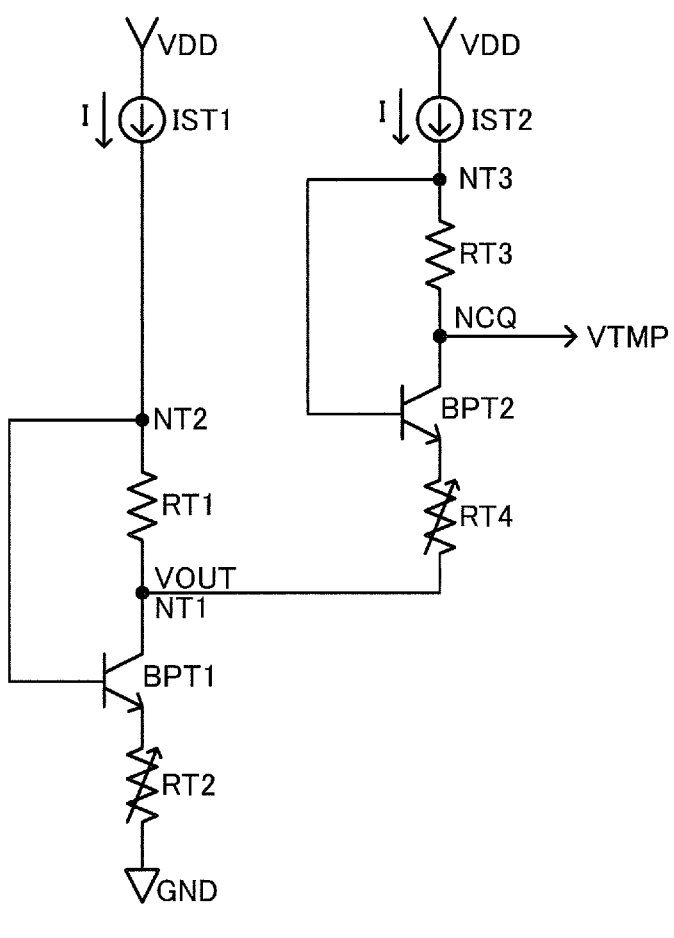
FIG. 16 is a second configuration example of the temperature sensor.

As shown in FIG. 16 which will be described later, the temperature sensor 22 may include bipolar transistors BPT1 and BPT2 and resistors RT1, RT2, RT3 and RT4. In this case, as shown in FIGS. 3 and 4, the capacitor CMIM having the MIM structure and at least the bipolar transistors BPT1 and BPT2 overlap in a plan view. For example, the resistors RT1, RT2, RT3, and RT4 can be disposed so as not to overlap with the capacitor CMIM in a plan view. For example, when heat from the heat generation source circuit 24 is transmitted to the bipolar transistors BPT1 and BPT2, an adverse effect such as a fluctuation in the temperature detection voltage VTMP occurs. In this regard, when the capacitor CMIM and the bipolar transistors BPT1 and BPT2 are disposed so as to overlap in a plan view, transmission of heat from the heat generation source circuit 24 to the bipolar transistors BPT1 and BPT2 is suppressed, and the adverse effect of heat on the temperature detection voltage VTMP can be suppressed. In the temperature sensor 22 having the configuration shown in FIG. 15, the capacitor CMIM having the MIM structure and at least the bipolar transistor BPT may be overlapped in a plan view.

Figure 5:
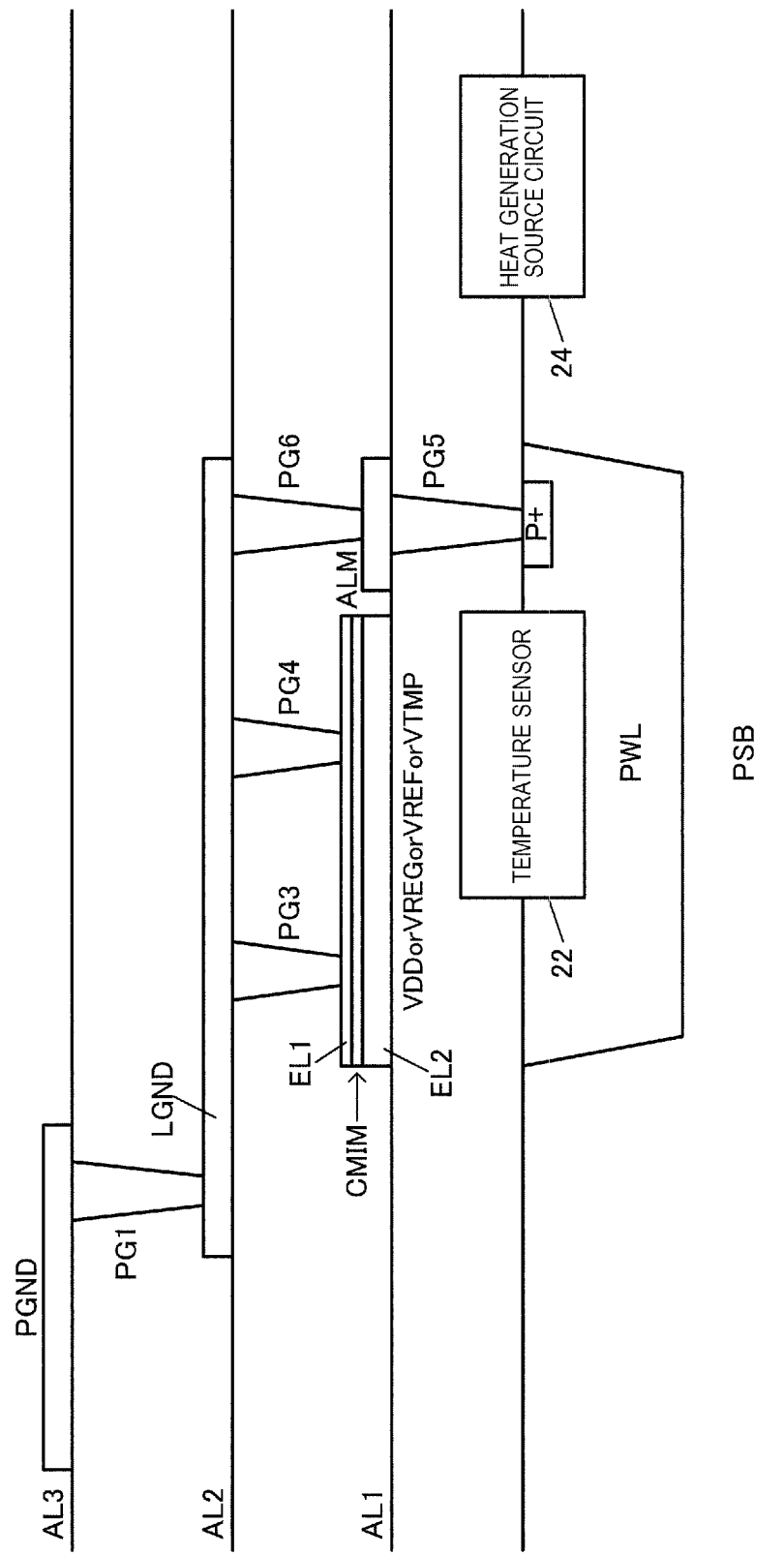
FIG. 5 is another example of the cross-sectional structure of the integrated circuit device.
Figure 6:
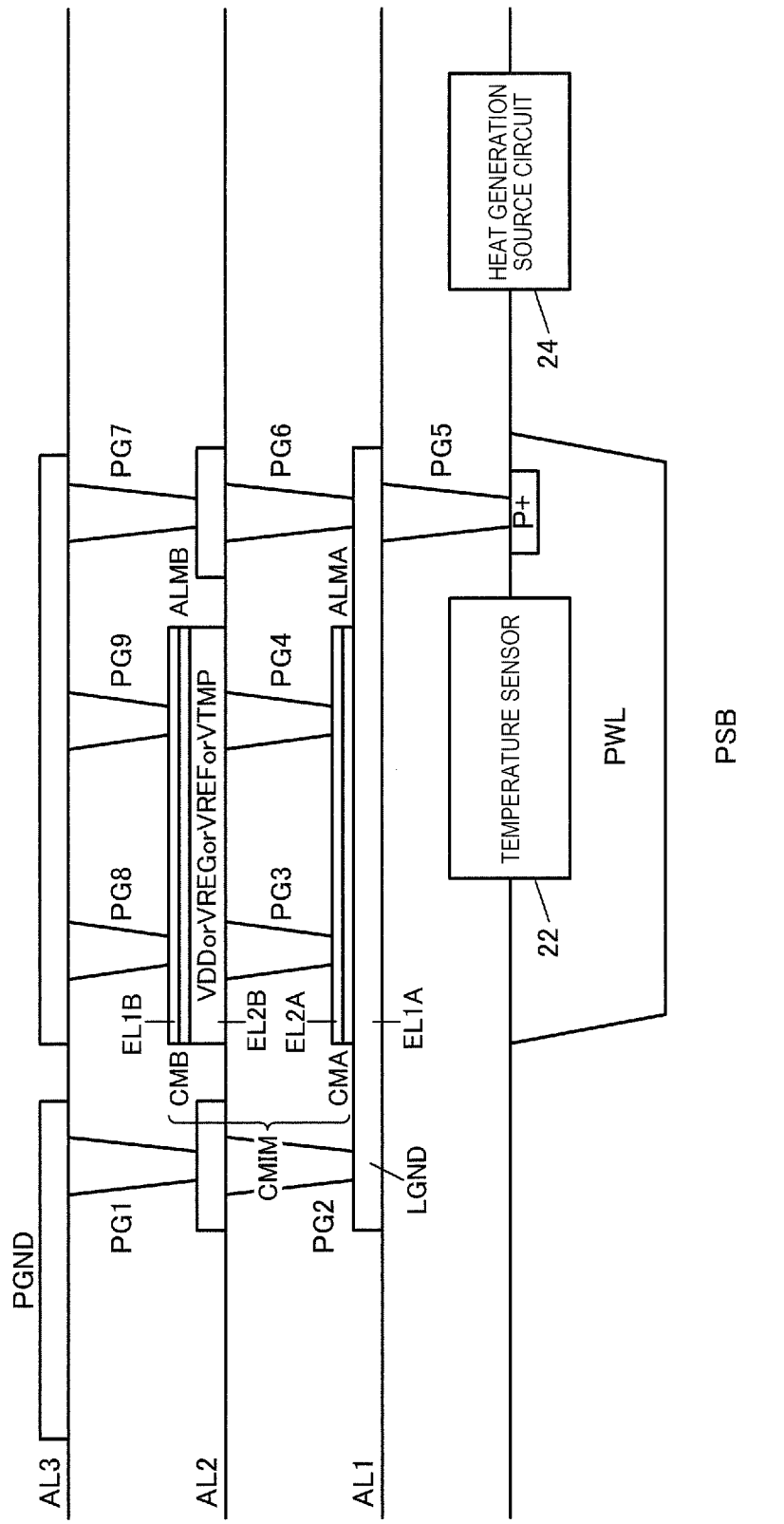
FIG. 6 is another example of the cross-sectional structure of the integrated circuit device.
Figure 7:
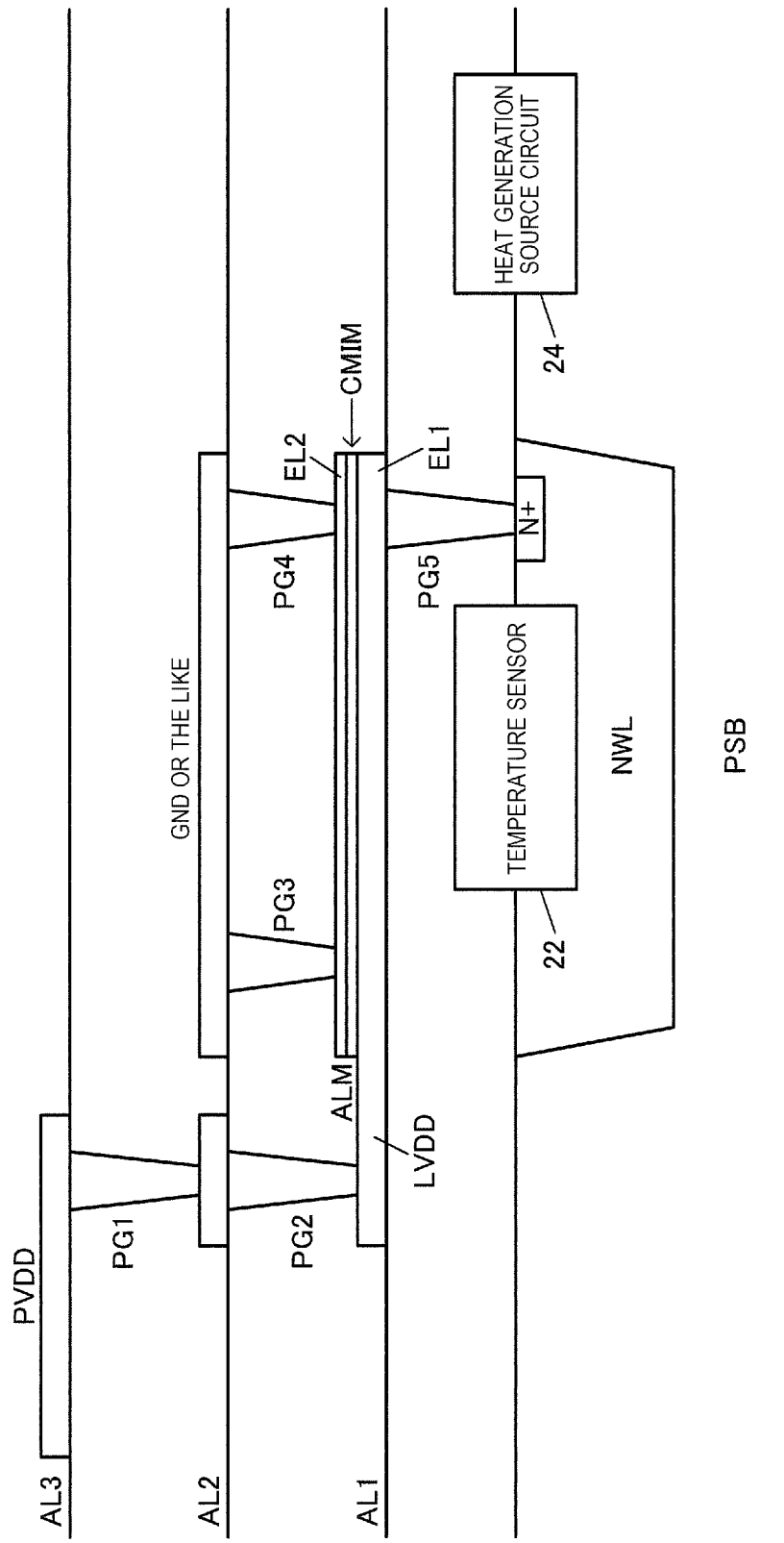
FIG. 7 is another example of the cross-sectional structure of the integrated circuit device.

FIGS. 5, 6, and 7 show other examples of the cross-sectional structure of the integrated circuit device. In FIG. 4 described above, one electrode EL1 of the capacitor CMIM to which the ground voltage is supplied is a lower electrode formed by the lower metal layer AL1, and the other electrode EL2 to which the voltage of VDD, VREG, VREF or VTMP is supplied is an upper electrode formed by the upper MIM metal layer ALM. In contrast, in FIG. 5, one electrode EL1 of the capacitor CMIM is an upper electrode formed by the upper MIM metal layer ALM, and the other electrode EL2 is the lower electrode formed by the lower metal layer AL1. The ground voltage from the ground pad PGND is supplied to the electrode EL1 as the upper electrode, and the voltage of VDD, VREG, VREF or VTMP is supplied to the electrode EL2 as the lower electrode.

In FIG. 6, a capacitor having an MIM stack structure is used as the capacitor CMIM. That is, the capacitor CMIM has a structure in which a lower capacitor CMA and an upper capacitor CMB are stacked. The ground voltage from the ground pad PGND is supplied to an electrode EL1A, which is a lower electrode of the capacitor CMA, and to an electrode EL1B, which is an upper electrode of the capacitor CMB. For example, a ground voltage is supplied from the ground line LGND to the electrode EL1B of the capacitor CMB via the power supply plugs PG6 and PG7, the wiring formed by the metal layer AL3, and the power supply plugs PG8 and PG9. The voltage of VDD, VREG, VREF or VTMP is supplied to an electrode EL2A which is the upper electrode of the capacitor CMA and an electrode EL2B which is the lower electrode of the capacitor CMB. By using such the MIM stack structure, it is possible to obtain twice the capacitance in the same area, and it is possible to realize a higher capacitance density.

FIG. 7 shows an example of a cross-sectional structure when the pad PDE for external coupling is a power supply pad PVDD. The power supply voltage VDD from the power supply pad PVDD is supplied to a power supply line LVDD via the metal plugs PG1 and PG2. As a result, the power supply voltage VDD is supplied to the electrode EL1 of the capacitor CMIM having the MIM structure. On the other hand, a ground voltage or the like is supplied to the electrode EL2 of the capacitor CMIM. In FIG. 7, an N-type well NWL is formed in the P-type substrate PSB, and an N+ diffusion layer, which is an N-type impurity layer, is formed in the well NWL. Then, the power supply voltage VDD from the power supply pad PVDD is supplied to the N+ diffusion layer via the power supply line LVDD, so that the substrate potential of the N-type well NWL is set to the power supply voltage VDD.

As described above, as shown in FIGS. 1 and 2, the integrated circuit device 20 of the present embodiment includes the temperature sensor 22, the heat generation source circuit 24, the pad PDE for external coupling, and the capacitor CMIM having the MIM structure. The capacitor CMIM and the temperature sensor 22 overlap in a plan view orthogonal to the substrate PSB. By disposing the capacitor CMIM so as to overlap the temperature sensor 22 in a plan view as described above, it is possible to suppress transmission of heat from the heat generation source circuit 24 to the temperature sensor 22.

For example, when heat from the heat generation source circuit 24 is transmitted to the temperature sensor 22, the temperature detection voltage VTMP fluctuates, which may adversely affect the operation of the integrated circuit device 20. Taking the integrated circuit device 20 for an oscillator as an example, a deviation in the temperature compensation of the oscillation frequency or a drift of the oscillation frequency at the time of startup occurs, and it takes time for the oscillation frequency to stabilize after the power is turned on.

In this regard, in the present embodiment, the capacitor CMIM overlaps the temperature sensor 22 in a plan view, and the capacitor CMIM is disposed above the temperature sensor 22. Therefore, the adverse effect of the heat transmission from the heat generation source circuit 24 is reduced, and the adverse effect on the operation of the integrated circuit device 20 is suppressed. Taking the integrated circuit device 20 for the oscillator as an example, it is possible to reduce the deviation of the temperature compensation and the drift at the time of starting.

For example, the heat transmission coefficient of aluminum forming the metal layer is about 250 W/mk, which is larger than the heat transmission coefficient of silicon, 149 W/mk. As shown in FIGS. 1 and 2, one electrode EL1 of the capacitor CMIM is electrically coupled to the pad PDE for external coupling. Since the pad PDE is coupled to the outside, the heat capacitance on the pad PDE side is large. Therefore, most of the heat from the heat generation source circuit 24 is dissipated from one electrode EL1 of the capacitor CMIM to the outside of a large heat capacitance via the metal layer coupling line LE and the pad PDE for external coupling. As a result, transmission of heat from the heat generation source circuit 24 to the temperature sensor 22 is suppressed, and it is possible to reduce the adverse effect on the operation of the integrated circuit device 20 due to the fluctuation of the temperature detection voltage VTMP.

In the integrated circuit device 20, many capacitors are required for stabilizing the voltage and processing the analog circuit. In this case, for example, when a capacitor with polysilicon or gate capacitance is used, it becomes impossible to form a circuit element such as a transistor in a region in which the capacitor is formed, and it is difficult to reduce the area of the integrated circuit device 20 due to the region in which the capacitor is formed. In this regard, in the present embodiment, the MIM capacitor CMIM is disposed in the region in which the temperature sensor 22 is formed. Therefore, the capacitor CMIM can be disposed using the region in which the temperature sensor 22 is formed, so that it is possible to prevent the integrated circuit device 20 from being enlarged due to the formation region of the capacitor CMIM. In particular, since the circuit of the temperature sensor 22 does not require so many metal layers, the region above the temperature sensor 22 is convenient as a region for forming the capacitor CMIM having the MIM structure.

As described above, according to the integrated circuit device 20 of the present embodiment, since the capacitor CMIM having the MIM structure is disposed so as to overlap the temperature sensor 22 in a plan view, it is possible to achieve both the reduction of the adverse effect due to the heat from the heat generation source circuit 24 and the reduction in the area of the integrated circuit device 20.

As shown in FIGS. 3, 4, 7, and the like, in the present embodiment, the pad PDE for external coupling is the ground pad PGND or the power supply pad PVDD. For example, when the pad PDE for external coupling is the ground pad PGND, the ground voltage is supplied to one electrode EL1 of the capacitor CMIM. When the pad PDE for external coupling is the power supply pad PVDD, the power supply voltage VDD is supplied to one electrode EL1 of the capacitor CMIM. With this configuration, the capacitor CMIM to which the ground voltage or the power supply voltage VDD is supplied can be disposed on one electrode by effectively utilizing the region where the temperature sensor 22 is disposed, and the capacitor required for the integrated circuit device 20 can be realized while suppressing an increase in area.

In the present embodiment, as shown in FIGS. 3 and 4, the pad PDE for external coupling is a ground pad PGND, and a ground voltage is supplied from a ground pad to one electrode EL1 of the capacitor CMIM having the MIM structure. The power supply voltage VDD from the power supply pad PVDD, the voltage generated from the power supply voltage VDD, or the temperature detection voltage VTMP of the temperature sensor 22 is supplied to the other electrode EL2 of the capacitor CMIM. Here, the voltage generated from the power supply voltage VDD is the regulated voltage VREG generated by a regulator 81 to which the power supply voltage VDD is supplied, as described later with reference to FIG. 18. Alternatively, the voltage generated from the power supply voltage VDD is the reference voltage VREF generated by a reference voltage generation circuit 90 to which the power supply voltage VDD is supplied, as described later with reference to FIG. 19.

In this manner, the capacitor CMIM having the MIM structure formed in the region where the temperature sensor 22 is disposed can be used as a capacitor for stabilizing the potential of the power supply voltage VDD, the voltage generated by the power supply voltage VDD, or the temperature detection voltage VTMP. For example, by stabilizing the potential of the power supply voltage VDD, stable circuit operation and improved circuit processing performance of the integrated circuit device 20 using an appropriate power supply voltage VDD can be achieved. Further, by stabilizing the potential of the regulated voltage VREG, which is a voltage generated by the power supply voltage VDD, for example, a stable operation of a circuit that operates using the regulated voltage VREG as a power supply voltage and an increase in the performance of the circuit can be achieved. Further, by stabilizing the potential of the reference voltage VREF which is a voltage generated by the power supply voltage VDD, stable operation of an analog circuit which operates using the reference voltage VREF and an increase in the performance of the analog circuit can be achieved. Further, by stabilizing the potential of the temperature detection voltage VTMP, it is possible to improve the performance of an analog circuit such as a temperature compensation circuit that operates based on the temperature detection voltage VTMP.

As shown in FIGS. 3 and 4, the pad PDE for external coupling is a ground pad PGND, and one electrode EL1 of the capacitor CMIM having the MIM structure is electrically coupled to the ground pad PGND via the ground line LGND. Then, the ground line LGND is electrically coupled to the substrate PSB via the metal plug PG5. As a result, the potential of the substrate PSB can be set to the ground voltage. Further, the metal plug PG5 is disposed between the temperature sensor 22 and the heat generation source circuit 24 in a plan view. For example, in FIG. 3, a plurality of metal plugs including the metal plug PG5 are disposed between the temperature sensor 22 and the heat generation source circuit 24. For example, a plurality of metal plugs are arranged and disposed along the longitudinal direction of the temperature sensor 22. These plurality of metal plugs are contact plugs for setting the potential of the substrate PSB to the ground voltage. In this way, the heat from the heat generation source circuit 24 is transmitted to the ground line LGND via a plurality of metal plugs arranged between the temperature sensor 22 and the heat generation source circuit 24, and is dissipated to the outside via the ground pad PGND. As a result, not only heat from the upper direction of the temperature sensor 22 but also heat transmitted in a direction parallel to the substrate PSB can be dissipated to the outside via the ground line LGND and the ground pad PGND. The adverse effect of the heat from the heat generation source circuit 24 on the operation of the integrated circuit device 20 can be reduced.

2. Heat Generation Source Circuit and Capacitor Having MIM Structure

The example in which the capacitor CMIM having the MIM structure is disposed so as to overlap the temperature sensor 22 in a plan view has been described above, but the present embodiment is not limited to this. For example, in FIGS. 8 and 9, the integrated circuit device 20 includes the temperature sensor 22, the heat generation source circuit 24, the pad PDE for external coupling which is a ground pad PGND or a power supply pad PVDD, and the capacitor CMIM having the MIM structure. In a plan view orthogonal to the substrate PSB, the capacitor CMIM having the MIM structure and the heat generation source circuit 24 overlap. That is, in FIGS. 1 to 7, the capacitor CMIM is provided in the region where the temperature sensor 22 is disposed, but in FIGS. 8 and 9, the capacitor CMIM having the MIM structure is provided in the region where the heat generation source circuit 24 is disposed.

In this way, the heat from the heat generation source circuit 24 is insulated by the capacitor CMIM provided in the region where the heat generation source circuit 24 is disposed, so that transmission of the heat to the temperature sensor 22 is suppressed. For example, heat from the heat generation source circuit 24 is dissipated to the outside via the electrode EL1 of the capacitor CMIM, the ground line LGND serving as the coupling line LE, and the ground pad PGND. As a result, the adverse effect of the heat from the heat generation source circuit 24 on the temperature detection result of the temperature sensor 22 and the operation of the integrated circuit device 20 can be reduced.

Figure 9:
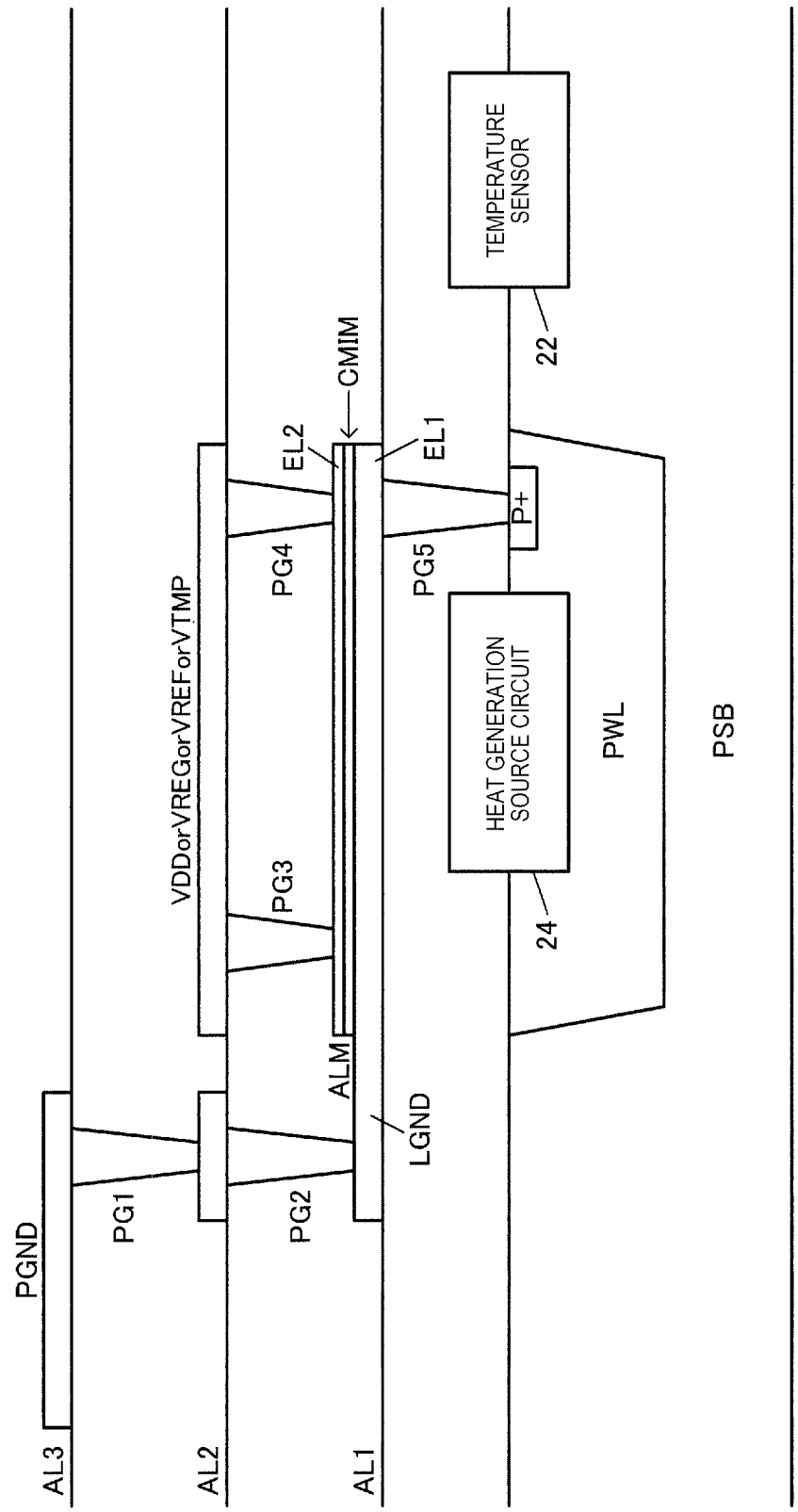
FIG. 9 is an example of a cross-sectional structure of the integrated circuit device in the second disposal example.

In FIGS. 8 and 9, one electrode EL1 of the capacitor CMIM is electrically coupled to the ground pad PGND via the ground line LGND, and the ground line LGND is electrically coupled to the substrate PSB via the metal plug PG5. The metal plug PG5 is disposed between the temperature sensor 22 and the heat generation source circuit 24 in a plan view. Specifically, as shown in FIG. 8, a plurality of metal plugs including the metal plug PG5 are disposed between the heat generation source circuit 24 and the temperature sensor 22. For example, a plurality of metal plugs are arranged and disposed along the longitudinal direction of the heat generation source circuit 24. These plurality of metal plugs are contact plugs for setting the potential of the substrate PSB to the ground voltage. In this way, heat from the heat generation source circuit 24 is transmitted to the ground line LGND via the plurality of metal plugs, and is dissipated to the outside via the ground pad PGND. As a result, not only heat from the upper direction of the heat generation source circuit 24 but also heat transmitted in a direction parallel to the substrate PSB can be dissipated to the outside via the ground line LGND and the ground pad PGND. It is possible to reduce the adverse effect of the heat from the heat generation source circuit 24 on the temperature detection result of the temperature sensor 22 and the operation of the integrated circuit device 20.

Figure 10:
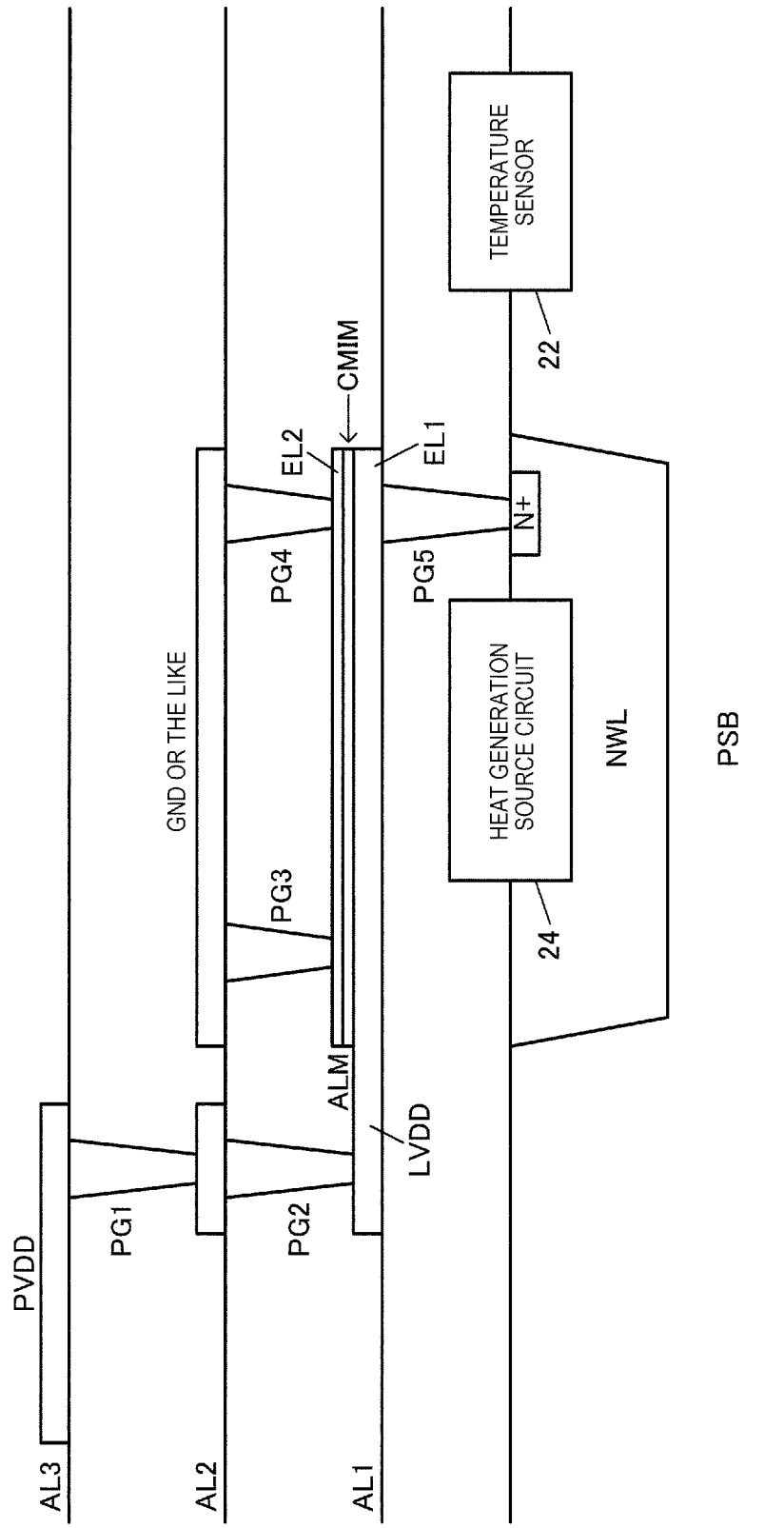
FIG. 10 is another example of the cross-sectional structure of the integrated circuit device in the second disposal example.

FIG. 10 shows an example of a cross-sectional structure when the pad PDE for external coupling is the power supply pad PVDD. The power supply voltage VDD from the power supply pad PVDD is supplied to the power supply line LVDD via the metal plugs PG1 and PG2. As a result, the power supply voltage VDD is supplied to the electrode EL1 of the capacitor CMIM having the MIM structure. On the other hand, a ground voltage or the like is supplied to the electrode EL2 of the capacitor CMIM. In FIG. 10, the power supply voltage VDD from the power supply pad PVDD is supplied to the N+ diffusion layer formed in the N-type well NWL via the power supply line LVDD. Thereby, the substrate potential of the N-type well NWL is set to the power supply voltage VDD.

Even when the capacitor CMIM and the heat generation source circuit 24 are disposed so as to overlap each other in a plan view, various modifications are possible, such as supplying a ground voltage to the electrode EL1 as the upper electrode as shown in FIG. 5, or using a capacitor having the MIM stack structure as shown in FIG. 6.

The capacitor CMIM having the MIM structure may be disposed so that at least a part thereof overlaps the heat generation source circuit 24. As an example, the capacitor CMIM may be disposed so that at least half or more of the entire area thereof overlaps the heat generation source circuit 24. For example, when the output circuit 40 shown in FIG. 17 described later is the heat generation source circuit 24, at least the capacitor CMIM and an output driver 46 may be disposed so as to overlap in a plan view.

3. Layout Disposal

Figure 11:
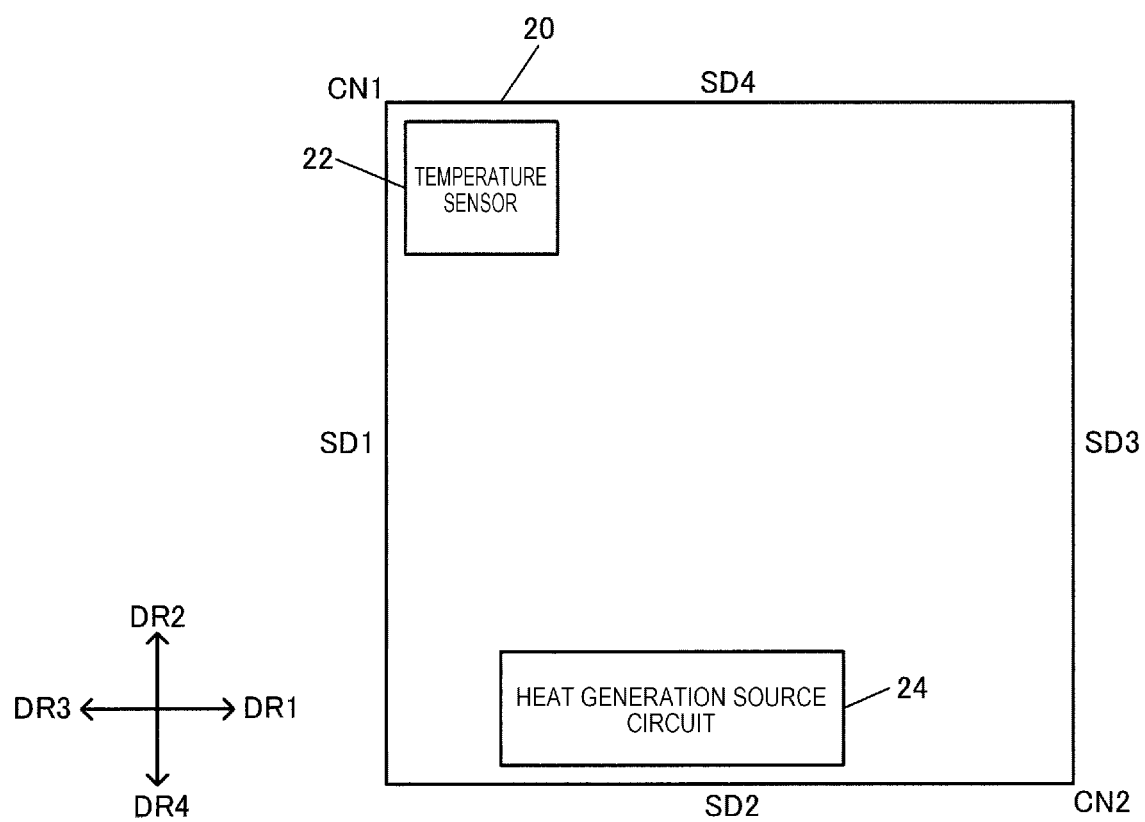
FIG. 11 is a layout disposal example of a temperature sensor and a heat generation source circuit.

Next, a layout disposal of the temperature sensor 22 and the heat generation source circuit 24 will be described. In FIG. 11, CN1 is a corner portion where the side SD1 and the side SD4 intersect, and CN2 is a corner portion where the side SD2 and the side SD3 intersect. The corner portions CN1 and CN2 are corner portions facing each other. In this case, in FIG. 11, the temperature sensor 22 is disposed at the corner portion CN1 where the two sides SD1 and SD4 of the integrated circuit device 20 intersect. For example, the temperature sensor 22 is disposed such that the first side of the temperature sensor 22 is along the side SD1 of the integrated circuit device 20 and the second side of the temperature sensor 22 is along the side SD4 of the integrated circuit device 20. That is, the temperature sensor 22 is disposed so that the position of the corner portion where the first side and the second side of the temperature sensor 22 intersect is the position of the corner portion CN1 of the integrated circuit device 20. For example, in this case, the temperature sensor 22 is a circuit element closest to the corner portion CN1. In other words, no other circuit element is provided between the CN 1 and the temperature sensor 22 in a plan view.

By disposing the temperature sensor 22 at the corner portion CN1, the distance between the heat generation source circuit 24 and the temperature sensor 22 disposed in the integrated circuit device 20 can be increased. Therefore, it is possible to suppress a situation in which the heat from the heat generation source circuit 24 adversely affects the temperature detection result of the temperature sensor 22 and the circuit performance of the integrated circuit device 20 is deteriorated.

In FIG. 11, the temperature sensor 22 is disposed along the side SD1 which is the first side of the integrated circuit device 20. For example, the first side of the temperature sensor 22 is disposed along the side SD1 of the integrated circuit device 20. In FIG. 11, the temperature sensor 22 is disposed at the corner portion CN1, but the temperature sensor 22 may be disposed at a position closer to the center of the side SD1. The heat generation source circuit 24 is disposed along the side SD2 which is a second side intersecting the side SD1 of the integrated circuit device 20. For example, the first side which is the long side of the heat generation source circuit 24 is disposed along the side SD2 of the integrated circuit device 20. Here, the circuit being disposed along the side of the integrated circuit device 20 means, for example, that the circuit is disposed such that no other circuit exists between the circuit and the side. For example, the circuit is disposed in a region having a predetermined width from the side. When another circuit is located in a direction opposite to the direction toward the side, the circuit is disposed between the other circuit and the side.

By disposing the temperature sensor 22 along the side SD1 of the integrated circuit device 20 and disposing the heat generation source circuit 24 along the side SD2, the distance between the temperature sensor 22 and the heat generation source circuit 24 can be increased. Therefore, it is possible to suppress the heat from the heat generation source circuit 24 from adversely affecting the temperature detection result of the temperature sensor 22.

Figure 12:
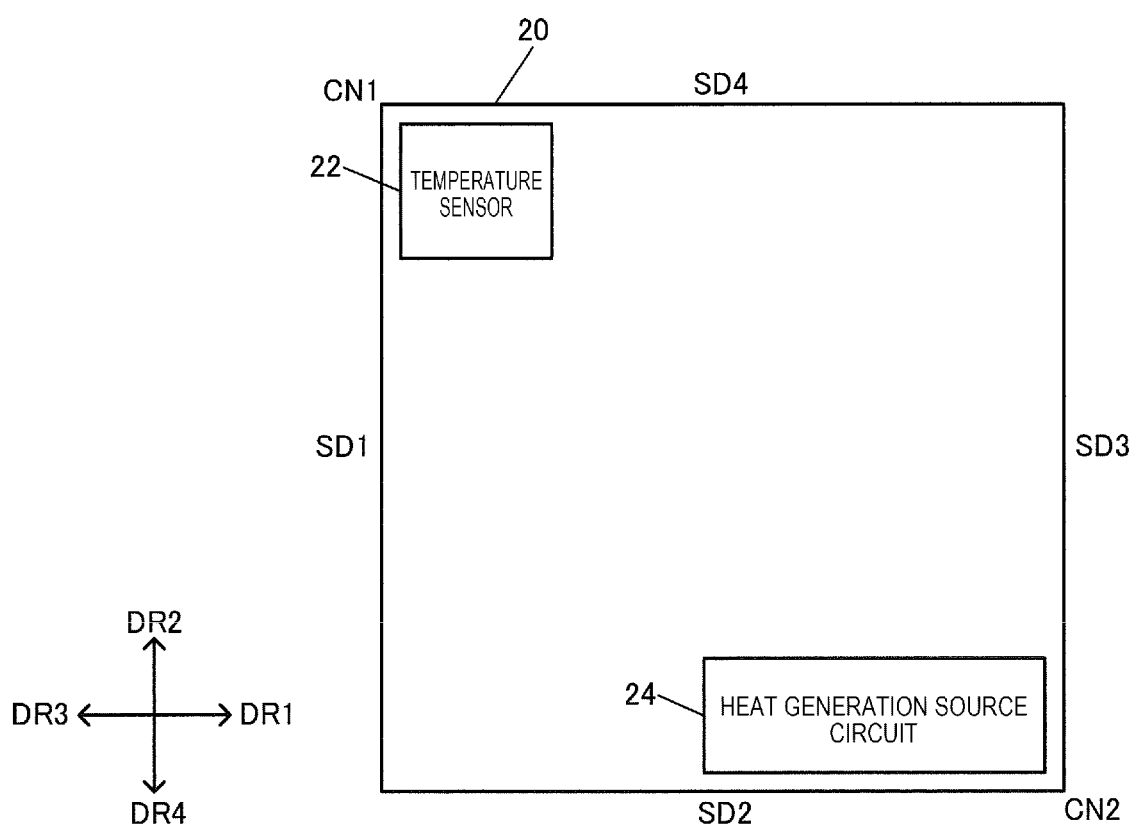
FIG. 12 is a layout disposal example of the temperature sensor and the heat generation source circuit.

As shown in FIG. 12, it is desirable that the temperature sensor 22 is disposed at the corner portion CN1 of the integrated circuit device 20, and the heat generation source circuit 24 is disposed at a corner portion CN2 facing the corner portion CN1 of the integrated circuit device 20. For example, the heat generation source circuit 24 is disposed such that the first side of the heat generation source circuit 24 is along the side SD2 of the integrated circuit device 20 and the second side of the heat generation source circuit 24 is along the side SD3 of the integrated circuit device 20. In this way, the distance between the temperature sensor 22 and the heat generation source circuit 24 can be maximized, so that it is possible to further effectively prevent the heat from the heat generation source circuit 24 from adversely affecting the temperature detection result of the temperature sensor 22.

4. Detailed Configuration Example

Figure 13:
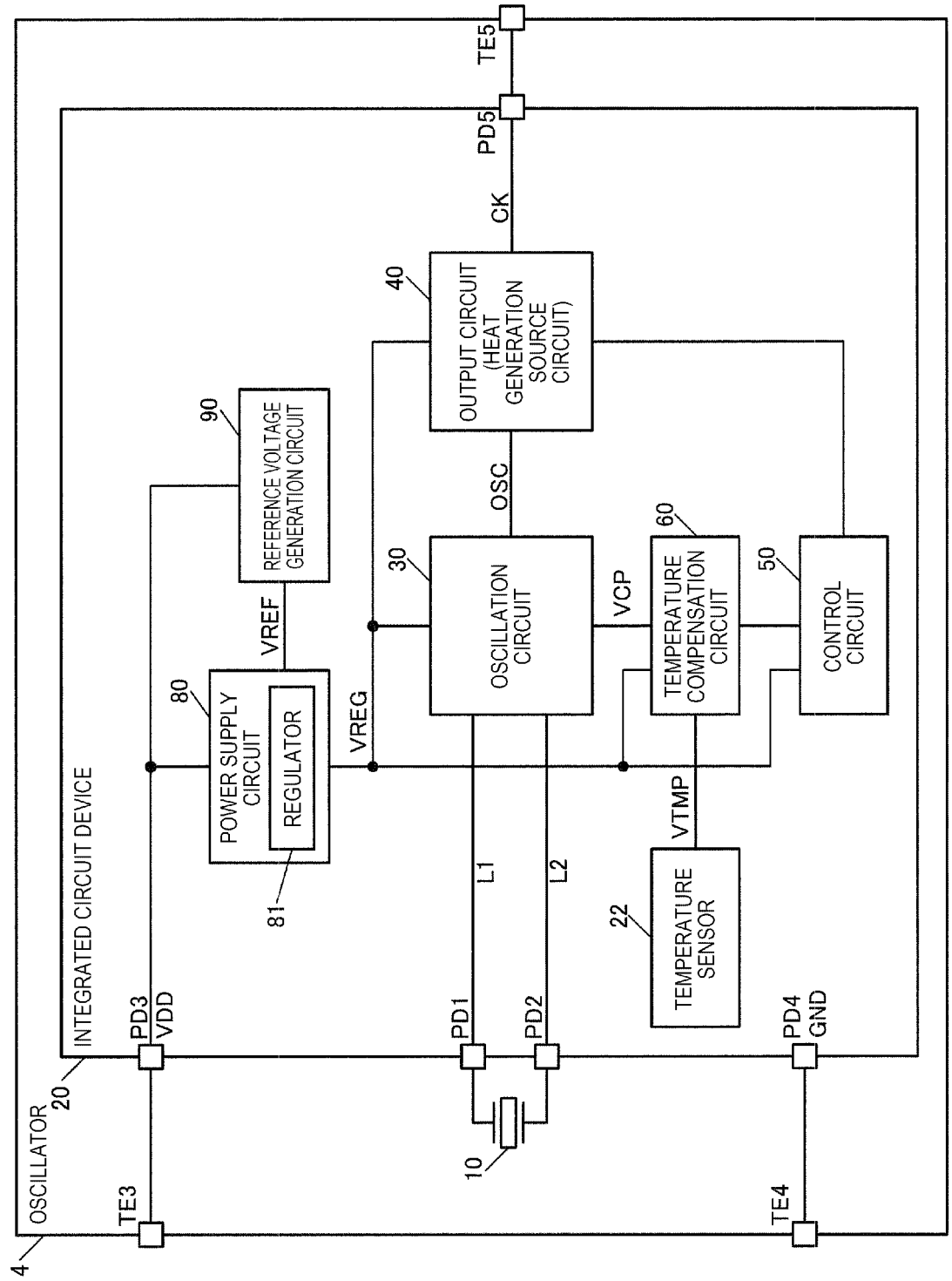
FIG. 13 is a configuration example of the integrated circuit device and an oscillator.

FIG. 13 shows a detailed configuration example of the integrated circuit device 20. FIG. 13 is a configuration example of the integrated circuit device 20 provided in the oscillator 4. In FIG. 13, for example, the output circuit 40 is the heat generation source circuit 24. Further, for example, a power supply circuit 80 and a control circuit 50 can also be the heat generation source circuit 24. In the following, description will be given mainly of the integrated circuit device 20 for an oscillation circuit as an example, but the present embodiment is not limited to this. The method according to the present embodiment can be applied to integrated circuit devices having various configurations incorporating a temperature sensor such as an integrated circuit device for a gyro sensor, an integrated circuit device for time-to-digital conversion, an integrated circuit device for driving a display panel such as a liquid crystal panel, or an integrated circuit device for driving a light source circuit such as an LED. In an integrated circuit device for a gyro sensor, a drive circuit of a gyro element, a detection circuit, and the like become the heat generation source circuit 24. In an integrated circuit device for time-to-digital conversion, a time-to-digital conversion circuit or the like becomes the heat generation source circuit 24. In an integrated circuit device for driving a display panel or an integrated circuit device for driving a light source circuit, a drive circuit or the like for driving the display panel or the light source circuit is the heat generation source circuit 24. When these integrated circuit devices include a high-speed serial interface circuit for transmitting differential signals and a clock signal generation circuit such as a PLL circuit for generating a high-speed clock signal, these high-speed serial interface circuits and the clock signal generation circuit become the heat generation source circuit 24.

As shown in FIG. 13, the integrated circuit device 20 includes the temperature sensor 22, an oscillation circuit 30, and the output circuit 40. The oscillator 4 of the present embodiment includes a vibrator 10 and the integrated circuit device 20. The vibrator 10 is electrically coupled to the integrated circuit device 20. For example, the vibrator 10 and the integrated circuit device 20 are electrically coupled using an internal wiring, a bonding wire, a metal bump, or the like of a package that houses the vibrator 10 and the integrated circuit device 20.

The vibrator 10 is an element that generates mechanical vibration by an electric signal. The vibrator 10 can be realized by a vibrator element such as a quartz crystal vibrator element. For example, the vibrator 10 can be realized by a quartz crystal vibrator element which performs thickness-shear vibration such as a quartz crystal vibrator element whose cut angle is AT cut or SC cut. For example, the vibrator 10 may be a vibrator incorporated in a temperature-compensated crystal oscillator (TCXO) that does not include a constant temperature chamber, or may be a vibrator incorporated in a thermostat crystal oscillator (OCXO) that includes a constant temperature chamber. The vibrator 10 of the present embodiment can be realized by various vibrator elements such as a vibrator element other than the thickness-shear vibration type and a piezoelectric vibrator element formed of a material other than quartz crystal. For example, as the vibrator 10, a surface acoustic wave (SAW) resonator, a micro electro mechanical systems (MEMS) vibrator as a silicon vibrator formed using a silicon substrate, or the like may be employed.

The integrated circuit device 20 is a circuit device called an integrated circuit (IC). For example, the integrated circuit device 20 is an IC manufactured by a semiconductor process, and is a semiconductor chip in which circuit elements are formed on a semiconductor substrate.

In the integrated circuit device 20, in addition to the temperature sensor 22, the oscillation circuit 30, and the output circuit 40, the control circuit 50, a temperature compensation circuit 60, the power supply circuit 80, the reference voltage generation circuit 90, and pads PD1, PD2, PD3, PD4 and PD5 can be included.

The pad PD1 is electrically coupled to one end of the vibrator 10, and the pad PD2 is electrically coupled to the other end of the vibrator 10. For example, the vibrator 10 and the pads PD1 and PD2 of the integrated circuit device 20 are electrically coupled using the internal wiring, a bonding wire, a metal bump, or the like of the package that houses the vibrator 10 and the integrated circuit device 20. The pad PD1 is a first pad, and the pad PD2 is a second pad. The pads PD1 and PD2 are electrically coupled to the oscillation circuit 30 via signal lines L1 and L2. The signal lines L1 and L2 are wirings that couple the pads PD1 and PD2 and the oscillation circuit 30.

The pad PD3 is a power supply pad to which the power supply voltage VDD is supplied. For example, the power supply voltage VDD is supplied to the pad PD3 from an external power supply device. The pad PD4 is a ground pad to which the ground voltage GND is supplied. GND can also be referred to as VSS, and the ground voltage is, for example, a ground potential. In the present embodiment, the ground is appropriately described as GND. The pad PD5 is a clock pad to which a clock signal CK generated based on the oscillation signal OSC of the oscillation circuit 30 is output. The clock signal CK is a signal having a signal format of a single-ended CMOS or clipped sine wave. The output circuit 40 may output the differential clock signals CK and CKX. In this case, the clock signals CK and CKX become the first clock signal and the second clock signal that constitute the differential clock signal.

The pads PD3, PD4 and PD5 are electrically coupled to external terminals TE3, TE4 and TE5 for external coupling of the oscillator 4, respectively. For example, it is electrically coupled using an internal wiring, a bonding wire, a metal bump, or the like of a package. The external terminals TE3, TE4, and TE5 of the oscillator 4 are electrically coupled to an external device.

The oscillation circuit 30 is a circuit for causing the vibrator 10 to oscillate. For example, the oscillation circuit 30 is electrically coupled to the pad PD1 and the pad PD2, and generates an oscillation signal OSC by causing the vibrator 10 to oscillate. For example, the oscillation circuit 30 drives the vibrator 10 via the signal lines L1 and L2 coupled to the pads PD1 and PD2 to cause the vibrator 10 to oscillate. For example, the oscillation circuit 30 includes an oscillation drive circuit provided between the pads PD1 and PD2. For example, the oscillation circuit 30 can be realized by a transistor such as a bipolar transistor that realizes a drive circuit and an active element such as a capacitor or a resistor. The drive circuit is a core circuit of the oscillation circuit 30, and the drive circuit oscillates the vibrator 10 by driving the vibrator 10 with current or voltage. As the oscillation circuit 30, various types of oscillation circuits such as Pierce type, Colpitts type, inverter type, and Hartley type can be used. Further, the oscillation circuit 30 may be provided with a variable capacitance circuit, and the oscillation frequency may be adjusted by adjusting the capacitance of the variable capacitance circuit. The variable capacitance circuit can be realized by a variable capacitance element such as a varactor. The variable capacitance circuit is electrically coupled, for example, to the signal line L1 to which the pad PD1 is coupled. The oscillation circuit 30 may include a first variable capacitance circuit electrically coupled to the signal line L1 to which the pad PD1 is coupled and a second variable capacitance circuit electrically coupled to the signal line L2 to which the pad PD2 is coupled. The coupling in the present embodiment is an electrical coupling. The electrical coupling means that an electrical signal is transmitted so that information can be transmitted by the electrical signal. The electrical coupling may be a coupling via an active element or the like.

The output circuit 40 outputs the clock signal CK based on the oscillation signal OSC from the oscillation circuit 30. For example, the output circuit 40 buffers the oscillation signal OSC from the oscillation circuit 30 and outputs the clock signal CK. For example, the output circuit 40 can perform waveform shaping of the oscillation signal OSC, level shift of the voltage level, and the like. The output circuit 40 may output the clock signal in a signal format such as low voltage differential signaling (LVDS), positive emitter coupled logic (PECL), high speed current steering logic (HCSL), or differential complementary MOS (CMOS).

The control circuit 50 performs various control processes. For example, the control circuit 50 controls the entire integrated circuit device 20. For example, the control circuit 50 controls the operation sequence of the integrated circuit device 20. The control circuit 50 performs various processes for controlling the oscillation circuit 30. The control circuit 50 can also control the output circuit 40 and the power supply circuit 80. The control circuit 50 can be realized by, for example, a circuit of an application specific integrated circuit (ASIC) using automatic placement and routing such as a gate array.

The temperature compensation circuit 60 performs temperature compensation of the oscillation frequency of the oscillation circuit 30. For example, the temperature compensation circuit 60 generates a temperature compensation voltage VCP based on the temperature detection voltage VTMP from the temperature sensor 22 and outputs the temperature compensation voltage VCP to the oscillation circuit 30, so that the temperature of the oscillation frequency of the oscillation circuit 30 is compensated. For example, the temperature compensation circuit 60 performs temperature compensation on the variable capacitance circuit included in the oscillation circuit 30 by outputting a temperature compensation voltage VCP that is a capacitance control voltage of the variable capacitance circuit. The temperature compensation is a process for suppressing and compensating the fluctuation of the oscillation frequency due to the temperature fluctuation. For example, the temperature compensation circuit 60 performs analog temperature compensation based on polynomial approximation. For example, when the temperature compensation voltage VCP for compensating the frequency temperature characteristic of the vibrator 10 is approximated by a polynomial, the temperature compensation circuit 60 performs analog temperature compensation based on coefficient information of the polynomial. The analog temperature compensation is temperature compensation realized by, for example, addition processing of a current signal and a voltage signal which are analog signals.

The power supply circuit 80 is supplied with the power supply voltage VDD from the pad PD3 and supplies various power supply voltages for the internal circuit of the integrated circuit device 20 to the internal circuit. For example, the power supply voltage VDD itself is supplied, or a regulated voltage VREG that is a voltage obtained by regulating the power supply voltage VDD from the outside is supplied. The regulator 81 provided in the power supply circuit 80 generates the regulated voltage VREG. The integrated circuit device 20 may not have a temperature compensation function. In this case, the oscillator 4 is an oscillator of simple packaged crystal oscillator (SPXO).

The reference voltage generation circuit 90 generates the reference voltage VREF based on the power supply voltage VDD. For example, the reference voltage VREF that is a constant voltage is generated even when there is a power supply voltage fluctuation or a temperature fluctuation. The reference voltage generation circuit 90 can be realized by, for example, a band gap reference circuit that generates the reference voltage VREF based on the band gap voltage.

The integrated circuit device 20 can include a storage portion for storing various data such as coefficient data for temperature compensation and data for voltage setting. This storage portion can be realized by a nonvolatile memory. As the non-volatile memory, for example, electrically erasable programmable read-only memory (EEPROM) capable of electrical erasure of data, one time programmable (OTP) memory using floating gate avalanche injection MOS (FAMOS), or the like can be used.

Figure 14:
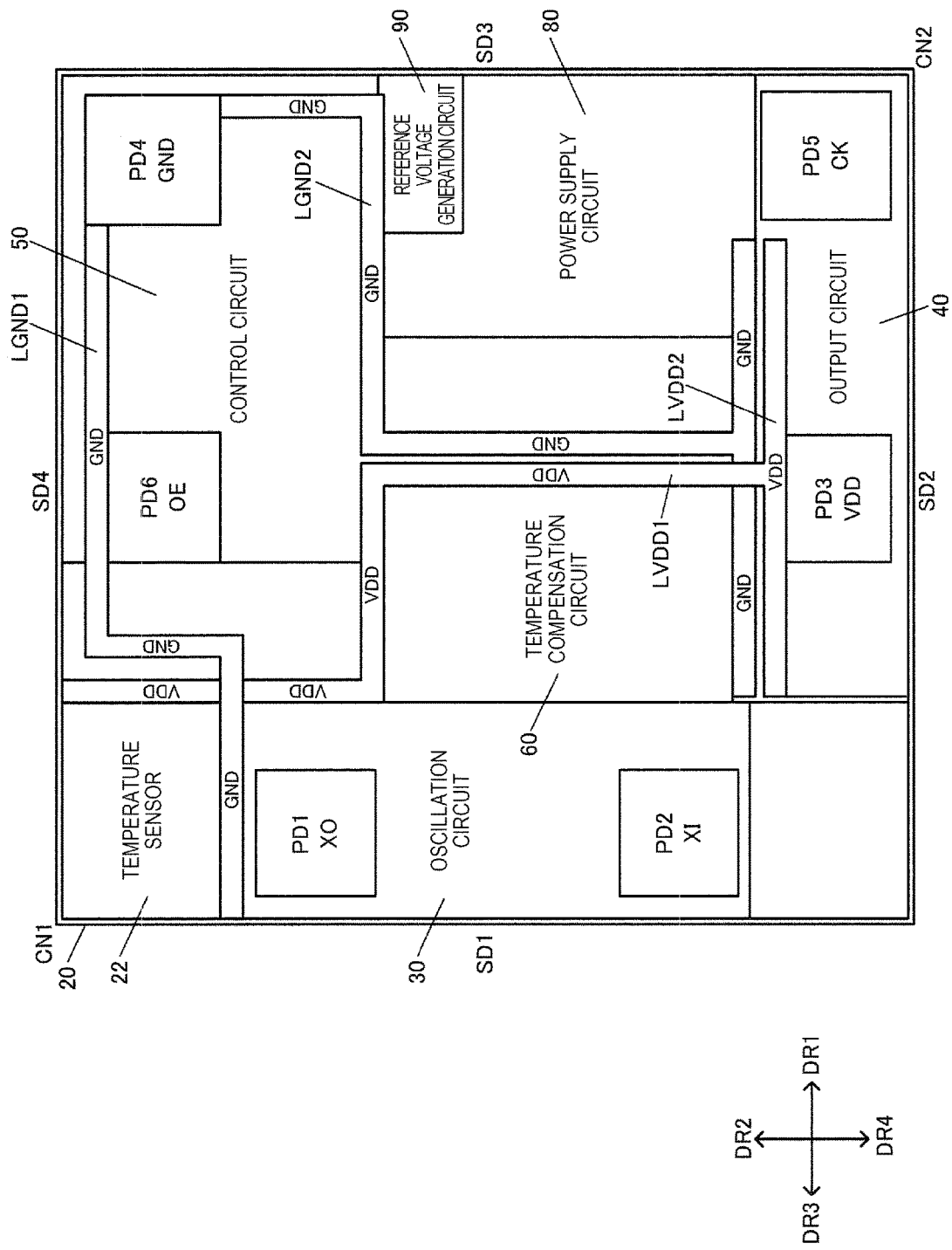
FIG. 14 is a layout disposal example of the integrated circuit device.

FIG. 14 shows a layout disposal example of the integrated circuit device 20 of FIG. 13. In the layout disposal example shown in FIG. 14, a circuit disposal region of each circuit of the integrated circuit device 20 is shown. The circuit disposal region is a region in which circuit elements constituting the circuit and wirings coupling the circuit elements are disposed. The circuit element is an active element such as a transistor or a passive element such as a resistor or a capacitor. Further, the layout disposal example of FIG. 14 shows a disposal example of the integrated circuit device 20 in a plan view in a direction orthogonal to a substrate on which circuit elements thereof are formed.

As shown in FIG. 14, the integrated circuit device 20 according to the present embodiment includes the temperature sensor 22, the oscillation circuit 30 for generating the oscillation signal OSC by oscillating the vibrator 10, and an output circuit 40 for buffering the oscillation signal OSC from the oscillation circuit 30 and outputting the clock signal CK. In this case, the heat generation source circuit 24 in the integrated circuit device 20 becomes the output circuit 40. For example, the output circuit 40 generates a large amount of heat because the output circuit 40 outputs the clock signal CK having a high frequency. In this regard, in the present embodiment, since the capacitor CMIM having the MIM structure is provided so as to overlap the temperature sensor 22 in a plan view, it is possible to suppress the heat from the output circuit 40, which is the heat generation source circuit 24, from adversely affecting the temperature detection result of the temperature sensor 22. This makes it possible to reduce the deviation of the temperature compensation and the drift at the time of starting due to the fluctuation of the temperature detection voltage VTMP. A pad PD6 is a pad for inputting an external signal such as an output enable signal or a standby signal.

The integrated circuit device 20 includes the pad PD1 electrically coupled to one end of the vibrator 10 and the pad PD2 electrically coupled to the other end of the vibrator 10. The pad PD1 is coupled to, for example, an output terminal XO of the oscillation circuit 30, and the pad PD2 is coupled to, for example, an input terminal XI of the oscillation circuit 30. As shown in FIG. 14, the distance between the temperature sensor 22 and the pad PD1 is shorter than the distance between the temperature sensor 22 and the output circuit 40. For example, the temperature sensor 22 is disposed between the oscillation circuit 30 and the side SD4. Specifically, the temperature sensor 22 is disposed adjacent to the oscillation circuit 30 on the side of the oscillation circuit 30 in the direction DR2, and the temperature sensor 22 is disposed adjacent to the pad PD1 in the oscillation circuit 30.

In this way, the distance between the pad PD1 and the temperature sensor 22 can be reduced, and for example, the temperature sensor 22 can be disposed adjacent to the pad PD1. Further, the distance between the pad PD2 and the temperature sensor 22 can be reduced. For example, it is desirable that the temperature sensor 22 ideally detects the temperature itself of the vibrator 10. However, since the temperature sensor 22 is incorporated in the integrated circuit device 20, the temperature of the vibrator 10 cannot be directly detected in the immediate vicinity of the vibrator 10. In this regard, the pad PD1 and the vibrator 10 are electrically coupled to each other using an internal wiring, a bonding wire, a metal bump, or the like of the package, and the internal wiring, the bonding wire, and the metal bump are formed of metal. Therefore, the temperature of the vibrator 10 is thermally conducted by the metal and transmitted to the pad PD1. Therefore, by disposing the temperature sensor 22 near the pad PD1, the temperature of the vibrator 10 can be more appropriately detected using the temperature sensor 22. As a result, the accuracy of temperature detection can be improved, the accuracy of temperature compensation can be improved, and high accuracy in the clock frequency can be achieved.

In FIG. 14, the distance between the temperature sensor 22 and the output circuit 40 is longer than the distance between the temperature sensor 22 and the pad PD1, and the output circuit 40 is disposed at a place away from the temperature sensor 22. By doing so, the distance of a heat transmission path from the output circuit 40 can be increased. As a result, it is possible to prevent the heat from the output circuit 40 from adversely affecting the temperature detection result of the temperature sensor 22 and deteriorating the accuracy of the temperature compensation, and to achieve a high accuracy of the clock frequency.

In FIG. 14, the temperature sensor 22 and the pads PD1 and PD2 are disposed along the side SD1 of the integrated circuit device 20, and the output circuit 40 is disposed along the side SD2 of the integrated circuit device 20. Specifically, the pads PD1 and PD2 are disposed in the oscillation circuit 30 along the side SD1 in a plan view. For example, the pads PD1 and PD2 are disposed in the circuit disposal region of the oscillation circuit 30 in a plan view in a direction orthogonal to the substrate on which the circuit elements are formed. For example, in the circuit disposal region of the oscillation circuit 30, the pads PD1 and PD2 are disposed at a position near the side SD1 along the direction DR2. For example, the pad being disposed along the side of the integrated circuit device 20 means that the pad is disposed such that no other pad exists between the pad and the side. For example, the pad is disposed in a region having a predetermined width from the side.

The output circuit 40 is disposed along the side SD2 which intersects the side SD1 of the integrated circuit device 20. For example, the output circuit 40 is disposed such that the side on the side SD2 side of the output circuit 40 is along the side SD2 of the integrated circuit device 20. For example, the side along the longitudinal direction of the output circuit 40 is disposed along the side SD2. In other words, the oscillation circuit 30 is disposed in a region near the side SD1, and the output circuit 40 is disposed in a region near the side SD2.

The pads PD1 and PD2 for coupling the vibrator are coupled to the oscillation circuit 30 via the signal lines L1 and L2 as shown in FIG. 13. Therefore, when the distance between the pads PD1 and PD2 increases, the wiring length of the signal lines L1 and L2 coupling the pads PD1 and PD2 and the oscillation circuit 30 increases. When the wiring length of the signal lines L1 and L2 is increased as described above, problems such as increase in parasitic resistance and parasitic capacitance of the signal lines L1 and L2 and deterioration of oscillation characteristics of the vibrator 10 occur. For example, problems such as deterioration of negative resistance and decrease in oscillation amplitude occur.

In this regard, in FIG. 14, the temperature sensor 22 and the oscillation circuit 30 are disposed along the side SD1, and the pads PD1 and PD2 are also disposed along the side SD1. That is, the temperature sensor 22, the oscillation circuit 30, and the pads PD1 and PD2 are all disposed at positions near the side SD1, and the temperature sensor 22 and the pads PD1 and PD2 are also disposed at positions near each other. More specifically, the pads PD1 and PD2 are disposed in the circuit disposal region of the oscillation circuit 30. Therefore, the pads PD1 and PD2 and the oscillation circuit 30 can be coupled by a short path, and the wiring length of the signal lines L1 and L2 can be reduced. By coupling the pads PD1 and PD2 and the oscillation circuit 30 with a short path in this manner, the wiring lengths of the signal lines L1 and L2 are shortened, and the parasitic resistance and the parasitic capacitance of the signal lines L1 and L2 can be reduced. Accordingly, it is possible to prevent the deterioration of the oscillation characteristics due to the increase in the wiring length of the signal lines L1 and L2. Further, when the pads PD1 and PD2 are disposed in the oscillation circuit 30, since the pads PD1 and PD2 can be disposed effectively using the circuit disposal region of the oscillation circuit 30 without separately providing the pad disposal regions for the pads PD1 and PD2, an efficient layout disposal is possible. Further, by disposing the temperature sensor 22 and the pads PD1 and PD2 along the side SD1, the distance between the temperature sensor 22 and the pads PD1 and PD2 can be reduced. By disposing the temperature sensor 22 near the pads PD1 and PD2 in this manner, the temperature of the vibrator 10 can be more appropriately detected using the temperature sensor 22.

In FIG. 14, the ground line LGND1 for supplying the ground voltage to the temperature sensor 22 and a ground line LGND2 for supplying the ground voltage to the output circuit 40 as the heat generation source circuit 24 are separately wired. For example, a ground line LGND1 and a ground line LGND2 branch from the position of the pad PD4, which is a ground pad, and are wired to the temperature sensor 22 and the output circuit 40. Similarly, a power supply line LVDD1 for supplying the power supply voltage VDD to the temperature sensor 22 and a power supply line LVDD2 for supplying the power supply voltage VDD to the output circuit 40 are separately wired. In this way, it is possible to suppress the heat generated in the output circuit 40 from being transmitted to the temperature sensor 22 via the metal layers of the ground lines LGND2 and LGND1. In other words, since the ground lines LGND2 and LGND1 are separated and wired, the path of heat transmitted through the ground lines LGND2 and LGND1 can be lengthened, so that the heat generated in the output circuit 40 can be suppressed from being transmitted to the temperature sensor 22 via the path. Similarly, it is possible to suppress the heat generated in the output circuit 40 from being transmitted to the temperature sensor 22 via the metal layers of the power supply lines LVDD2 and LVDD1.

In FIG. 14, the oscillation circuit 30 is disposed along the side SD1, and the output circuit 40 is disposed along the side SD2 intersecting the side SD1. Accordingly, the distance between the oscillation circuit 30 and the output circuit 40 can be reduced, and signal propagation with a shortened high frequency signal path is possible.

For example, when the vibrator 10 is oscillated at a high oscillation frequency such as 100 MHz or higher, the frequency of the oscillation signal OSC output from the oscillation circuit 30 and the frequency of the clock signal CK also increase. When a high frequency signal, which is a signal with high frequency, propagates through a signal line having a long wiring length, a large radiation noise is generated from the signal line. In addition, a signal line having a long wiring length may adversely affect the characteristics of the oscillation signal OSC.

In this regard, in FIG. 14, by disposing the oscillation circuit 30 along the side SD1 and disposing the output circuit 40 along the side SD2, the oscillation circuit 30 and the output circuit 40 can be coupled by a short path. Therefore, the wiring length of the signal line through which the high frequency signal propagates can be shortened, and radiation noise generated from the signal line can be reduced. Further, since the wiring length of the signal line through which the high frequency signal propagates is shortened, the adverse effect of the parasitic resistance or parasitic capacitance of the signal line on the characteristics of the oscillation signal can be reduced.

Since the oscillation circuit 30 is disposed near the side SD1 and the output circuit 40 is disposed near the side SD2, the region on the direction DR1 side of the oscillation circuit 30 and on the direction DR2 side of the output circuit 40 can be used, for example, as a disposal region for the temperature compensation circuit 60, the power supply circuit 80, and the control circuit 50. Therefore, an efficient layout disposal of the circuit blocks of the integrated circuit device 20 is possible, and the circuit area can be reduced, so that the integrated circuit device 20 can be reduced in size.

Since the output circuit 40 serves as a noise source that generates a large noise and a heat source that generates a high temperature because the output circuit 40 buffers and drives a high frequency signal. In FIG. 14, the output circuit 40 serving as such a noise source and a heat source is disposed along the side SD2. Accordingly, since the output circuit 40 can be disposed close to the side SD2, for example, a circuit that is desired to be away from the noise source or the heat source can be disposed, for example, on the side SD4 opposite to the side SD2. For example, by disposing the temperature sensor 22 on the side SD4 opposite to the side SD2 at which the output circuit 40 is disposed, it is possible to reduce the adverse effect of the heat from the output circuit 40 on the temperature detection by the temperature sensor 22. As a result, it is possible to achieve high accuracy of temperature compensation of the temperature compensation circuit 60 and the like. Further, by disposing the reference voltage generation circuit 90 on the side SD4 side, it is possible to reduce the adverse effect of noise from the output circuit 40 on the generation of the reference voltage VREF in the reference voltage generation circuit 90. For example, when the reference voltage VREF generated by the reference voltage generation circuit 90 fluctuates due to noise from the output circuit 40, the temperature compensation of the temperature compensation circuit 60 and the oscillation operation of the oscillation circuit 30 are adversely affected, and problems such as an increase in the phase noise occur. By disposing the output circuit 40 along the side SD2, it is possible to increase the distance between the output circuit 40 and the reference voltage generation circuit 90, and it is possible to prevent such a problem from occurring.

The integrated circuit device 20 includes the temperature compensation circuit 60 for performing the oscillation frequency temperature compensation of the oscillation circuit 30 based on the temperature detection voltage VTMP from the temperature sensor 22. When the direction from the side SD1 to the side SD3 is DR1, and the direction from the side SD2 to the side SD4 is DR2, the temperature compensation circuit 60 is disposed in the direction DR1 of the oscillation circuit 30 and the direction DR2 of the output circuit 40. That is, the temperature compensation circuit 60 is disposed in the circuit disposal region on the direction DR1 side of the oscillation circuit 30 and in the circuit disposal region on the direction DR2 side of the output circuit 40.

In this way, the temperature compensation circuit 60 can be disposed by effectively utilizing the space in the direction DR1 of the oscillation circuit 30 and in the direction DR2 of the output circuit 40. For example, the temperature compensation circuit 60 is a circuit that performs analog-type temperature compensation based on polynomial approximation, so that the circuit area increases. In this regard, the region on the direction DR1 side of the oscillation circuit 30 disposed along the side SD1 and on the direction DR2 side of the output circuit 40 disposed along the side SD2 is an empty space. By disposing the temperature compensation circuit 60 having a large circuit area in the space, an efficient layout disposal is possible. As a result, the area of the integrated circuit device 20 can be reduced. Further, by disposing the temperature compensation circuit 60 in the direction DR1 of the oscillation circuit 30, the temperature compensation voltage VCP from the temperature compensation circuit 60 is input to the oscillation circuit 30 through a short path so that the oscillation frequency can be controlled.

The integrated circuit device 20 includes the control circuit 50 for controlling the temperature compensation circuit 60. The control circuit 50 is disposed in the direction DR2 of the temperature compensation circuit 60. In other words, the temperature compensation circuit 60 is disposed between the output circuit 40 and the control circuit 50. The control circuit 50 is disposed along the side SD4, for example. For example, the output circuit 40 is disposed between the temperature compensation circuit 60 and the side SD2, and the control circuit 50 is disposed between the temperature compensation circuit 60 and the side SD4. The oscillation circuit 30 is disposed between the temperature compensation circuit 60 and the side SD1. That is, with the temperature compensation circuit 60 as the center, the oscillation circuit 30 is disposed in the direction of the side SD1, the output circuit 40 is disposed in the direction of the side SD2, and the control circuit 50 is disposed in the direction of the side SD4.

By disposing the control circuit 50 in this manner, the control circuit 50 for controlling the temperature compensation circuit 60 can be disposed, for example, adjacent to the temperature compensation circuit 60 in the direction DR2 of the temperature compensation circuit 60. Therefore, the control signal from the control circuit 50 can be input to the temperature compensation circuit 60 through a short path. When the oscillation circuit 30 is disposed along the side SD1 and the output circuit 40 is disposed along the side SD2, the control circuit 50 can be disposed by, for example, automatic placement and routing by effectively utilizing the space along the side SD4, and thereby, an efficient layout disposal is possible. As a result, the integrated circuit device 20 can be downsized.

5. Temperature Sensor, Output Circuit, Regulator, Reference Voltage Generation Circuit FIG. 15 shows a first configuration example of the temperature sensor 22. The temperature sensor 22 includes a current source IST and the bipolar transistor BPT provided in series between a VDD power supply node and a GND node. The collector node and the base node of the bipolar transistor BPT are coupled to each other and are diode-coupled. As a result, the temperature detection voltage VTMP having temperature dependency is output from an output node NCQ of the temperature sensor 22. For example, a temperature detection voltage VTMP having a negative temperature characteristic generated due to the temperature dependency of the base-emitter voltage is output.

FIG. 16 shows a second configuration example of the temperature sensor 22. The temperature sensor 22 includes current sources IST1 and IST2, bipolar transistors BPT1 and BPT2, and resistors RT1, RT2, RT3, and RT4. The resistors RT2 and RT4 are variable resistors whose resistance values are variable. The current source IST1 is provided between the VDD power supply node and a node NT2 to which the base of the bipolar transistor BPT1 is coupled. The resistor RT1 is provided between the node NT2 and a node NT1 serving as a collector node of the bipolar transistor BPT1. The resistor RT2 is provided between the emitter node of the bipolar transistor BPT1 and the GND node. The current source IST2 is provided between the VDD power supply node and a node NT3 to which the base of the bipolar transistor BPT2 is coupled. The resistor RT3 is provided between the node NT3 and the output node NCQ serving as a collector node of the bipolar transistor BPT1. The resistor RT4 is provided between the emitter node of the bipolar transistor BPT2 and the node NT1. Then, the temperature detection voltage VTMP is output from the output node NCQ.

In FIG. 16, the current value of the current flowing through the current sources IST1 and IST2 is I, the base-emitter voltages of the bipolar transistors BPT1 and BPT2 are VBE1 and VBE2, and the resistance values of the resistors RT1, RT2, RT3, and RT4 are R1, R2, R3, and R4, and the voltage output from the node NT1 is VOUT. In this case, VOUT and VTMP are obtained as in the following equations (1) and (2).

$$VOUT = VBE1 + 2 \times I \times R2 - I \times R1 \qquad (1)$$

$$VTMP = VBE2 + I \times R4 + VOUT - I \times R3 = VBE1 + VBE2 + I \times (2 \times R2 + R4 - R1 - R3) \qquad (2)$$

As shown in the above equation (2), by adjusting the resistance values R2 and R4 of the resistors RT2 and RT4, which are variable resistors, it is possible to perform zero-order adjustment in temperature compensation. That is, the offset adjustment of the temperature detection voltage VTMP becomes possible. According to the configuration of FIG. 16, the temperature detection voltage VTMP is generated using the two base-emitter voltages VBE1 and VBE2, so that the sensitivity of temperature detection can be improved.

The temperature detection voltage VTMP of the temperature sensor 22 is generated based on the base-emitter voltages VBE1 and VBE2 of the bipolar transistors BPT1 and BPT2. Therefore, as described with reference to FIGS. 3 and 4, by disposing the capacitor CMIM having the MIM structure and the bipolar transistors BPT1 and BPT2 so as to overlap in a plan view, the fluctuation of the base-emitter voltages VBE1 and VBE2 due to the heat from the heat generation source circuit 24 is suppressed, and the fluctuation of the temperature detection voltage VTMP can be suppressed.

The temperature sensor 22 is not limited to the configuration shown in FIGS. 15 and 16. For example, the temperature sensor 22 may be a circuit having another configuration different from FIGS. 15 and 16 that uses the base-emitter voltage of the bipolar transistor as the temperature-dependent voltage. Alternatively, the temperature sensor 22 may be a circuit that uses the forward voltage of the diode as the temperature-dependent voltage, a circuit that uses the temperature dependency of the resistance value of the resistor, a circuit that combines a bipolar transistor, a diode, and a resistor, or a circuit that uses the temperature dependency of the oscillation frequency.

Figure 17:
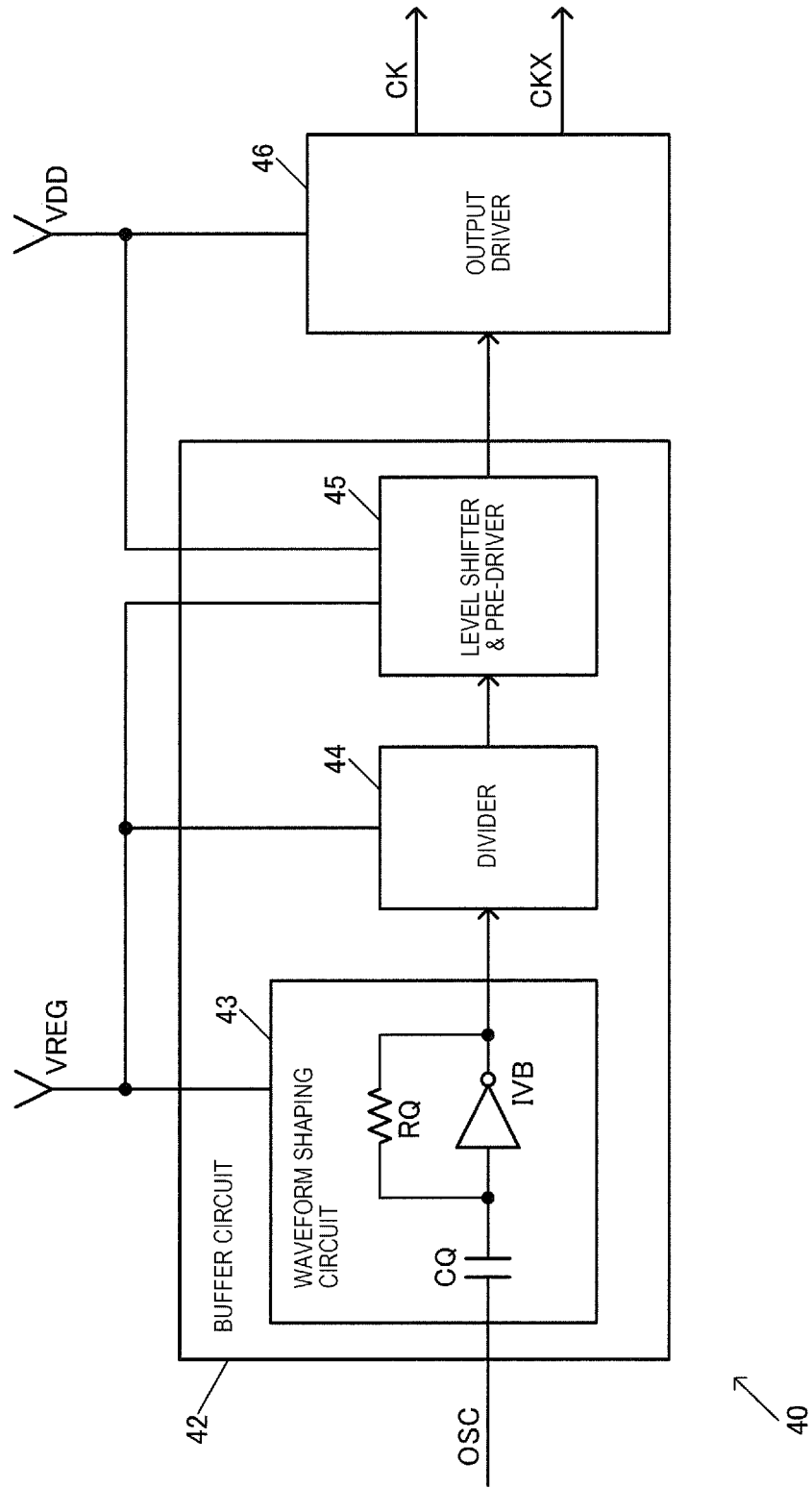
FIG. 17 is a configuration example of an output circuit.

FIG. 17 shows a configuration example of the output circuit 40. The output circuit 40 includes a buffer circuit 42 that performs buffering of the oscillation signal OSC and the output driver 46 that outputs and drives the clock signals CK and CKX based on the oscillation signal OSC. Although FIG. 17 shows an example of the output circuit 40 that outputs the differential clock signals CK and CKX, the output circuit 40 may output a single-ended clock signal CK.

The buffer circuit 42 can include, for example, a waveform shaping circuit 43, a divider 44, and a level shifter & pre-driver 45. The waveform shaping circuit 43 is a circuit that performs waveform shaping of the oscillation signal OSC and outputs a rectangular wave signal corresponding to the oscillation signal OSC, and is provided between an inverter IVB and a feedback resistor RQ provided between the output terminal and input terminal of the inverter IVB. The divider 44 is a circuit that divides the clock. By providing the divider 44, the clock signals CK and CKX having a frequency obtained by dividing the frequency of the oscillation signal OSC can be output. The level shifter & pre-driver 45 is a circuit that performs a level shift from a power supply voltage level of VREG to a power supply voltage level of VDD and a predrive that drives the output driver 46. For example, the regulated voltage VREG is supplied to the waveform shaping circuit 43 and the divider 44 of the buffer circuit 42, and the regulated voltage VREG and the power supply voltage VDD are supplied to the level shifter & pre-driver 45. On the other hand, the power supply voltage VDD is supplied to the output driver 46.

The output driver 46 can include at least one of an LVDS driver circuit, a PECL driver circuit, an HCSL driver circuit, a differential or single-ended CMOS driver circuit, and a differential or single-ended clipped sine output driver circuit. When a plurality of driver circuits are provided in the output driver 46, some of the transistors constituting the plurality of driver circuits may be shared among the plurality of driver circuits.

Figure 18:
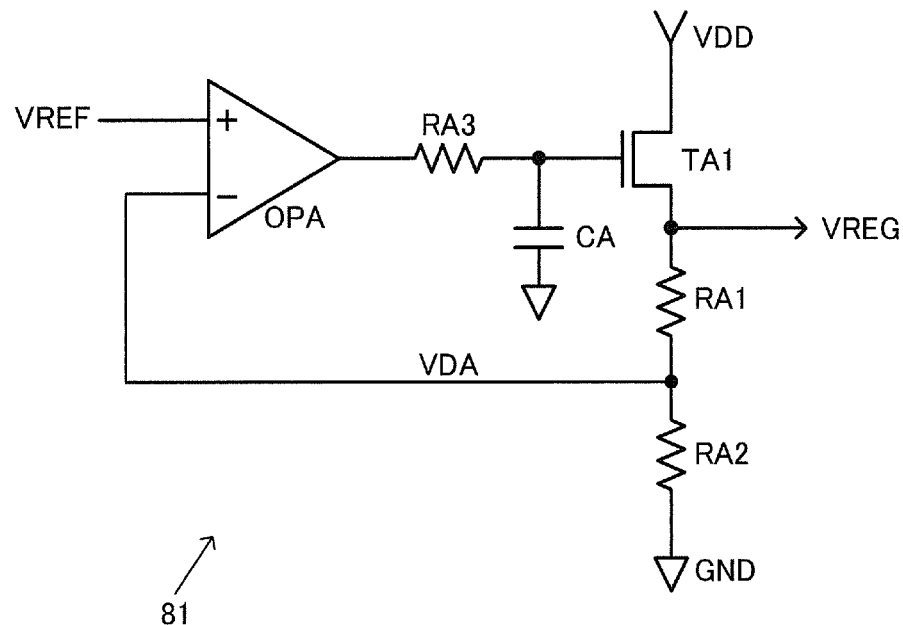
FIG. 18 is a configuration example of a regulator.

FIG. 18 shows a configuration example of the regulator 81. The regulator 81 includes a driving N-type transistor TA1 and resistors RA1 and RA2 provided in series between the VDD node and the GND node, and an operational amplifier OPA. The regulator 81 can include a resistor RA3 and a capacitor CA provided on the output terminal side of the operational amplifier OPA. The reference voltage VREF is input to a non-inverting input terminal of the operational amplifier OPA, and the voltage VDA obtained by dividing the regulated voltage VREG by the resistors RA1 and RA2 is input to an inverting input terminal. Then, the output terminal of the operational amplifier OPA is input to the gate of the transistor TA1 via the resistor RA3, and the regulated voltage VREG is output from the drain node of the transistor TA1. Although an N-type transistor is used as the driving transistor TA1 in FIG. 18, a P-type transistor may be used.

Figure 19:
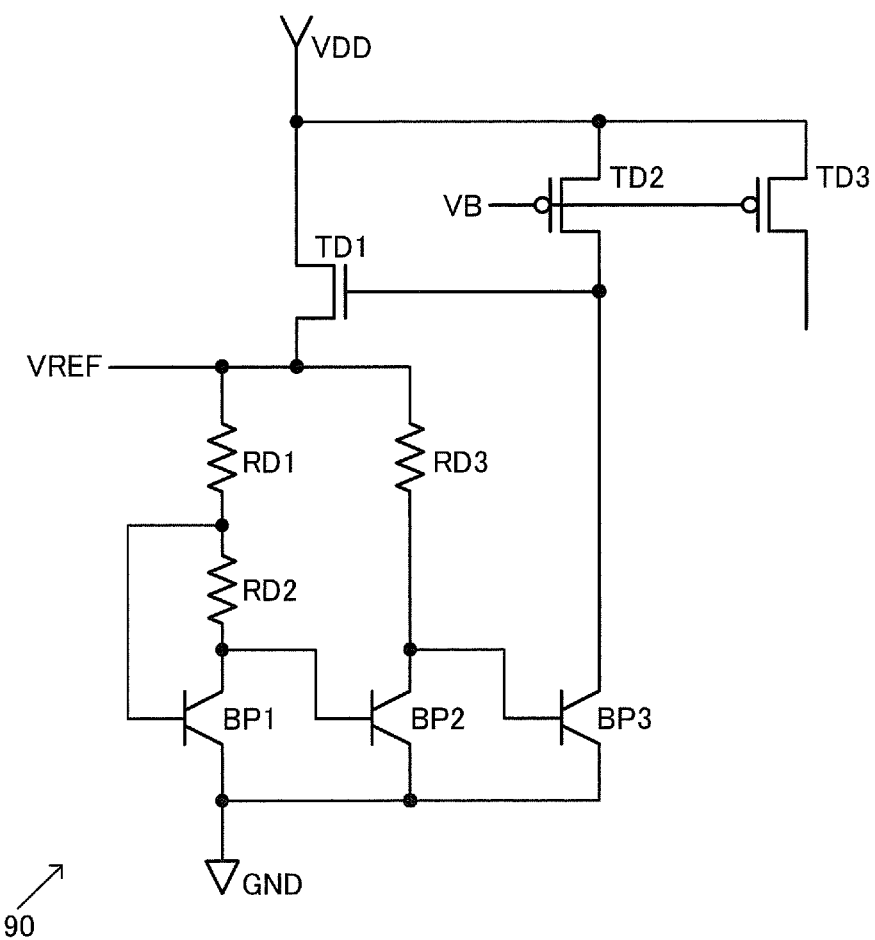
FIG. 19 is a configuration example of a reference voltage generation circuit.

FIG. 19 shows a configuration example of the reference voltage generation circuit 90. The reference voltage generation circuit 90 includes an N-type transistor TD1, resistors RD1, RD2, and RD3, and bipolar transistors BP1 and BP2 provided between the VDD node and the GND node. The reference voltage generation circuit 90 includes P-type transistors TD2 and TD3 to which the bias voltage BS is input to the gate, and a bipolar transistor BP3 provided between the drain node of the transistor TD2 and the GND node. The reference voltage generation circuit 90 is a band gap reference circuit, and generates and outputs a reference voltage VREF based on the band gap voltage. For example, the base-emitter voltages of the PNP-type bipolar transistors BP1 and BP2 are VBEA and VBEB, and $\Delta VBE=VBEA-VBEB$. The reference voltage generation circuit 90 outputs the reference voltage VREF that satisfies, for example, $VREF=K\times\Delta VBE+VBEB$. K is set by the resistance values of the resistors RD1 and RD2. For example, since VBEB has a negative temperature characteristic and $\Delta VBE$ has a positive temperature characteristic, a constant voltage reference voltage VREF having no temperature dependency can be generated by adjusting the resistance values of the resistors RD1 and RD2. The reference voltage generation circuit 90 is not limited to the configuration illustrated in FIG. 19, and various types of circuits such as a circuit that generates a reference voltage VREF using a work function difference voltage of a transistor can be used.

6. Oscillator

Figure 20:
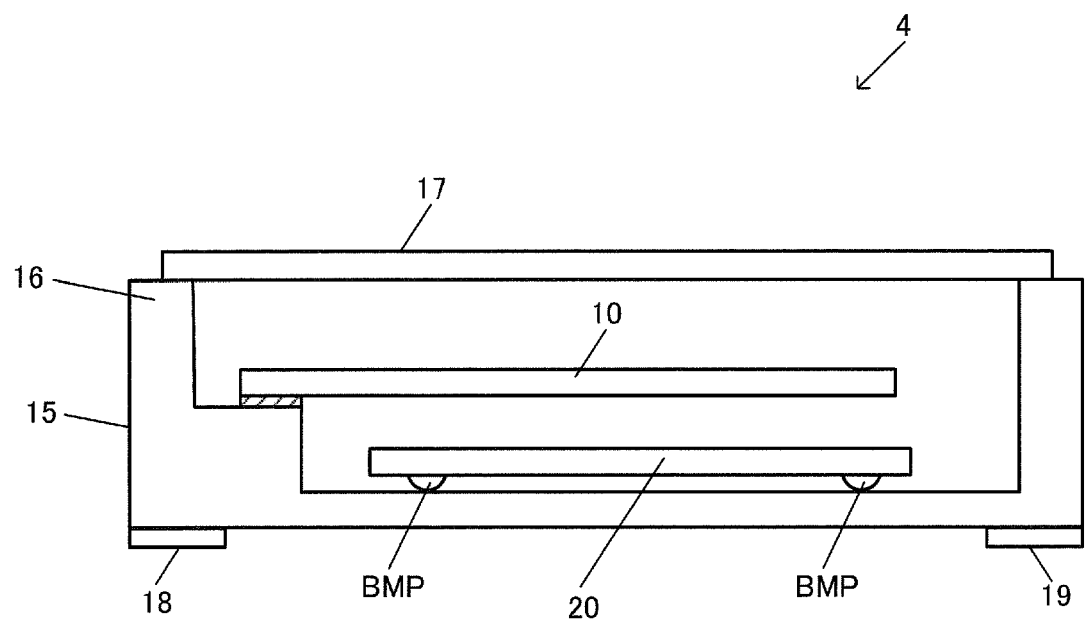
FIG. 20 is a first structural example of the oscillator.

Next, a structural example of the oscillator 4 of the present embodiment will be described. FIG. 20 shows a first structural example of the oscillator 4. The oscillator 4 includes the vibrator 10, the integrated circuit device 20, and a package 15 that houses the vibrator 10 and the integrated circuit device 20. The package 15 is formed of, for example, ceramic or the like, and has a storage space inside thereof. The vibrator 10 and the integrated circuit device 20 are stored in the storage space. The storage space is hermetically sealed and is preferably in a reduced pressure state that is close to a vacuum. The package 15 can suitably protect the vibrator 10 and the integrated circuit device 20 from impact, dust, heat, moisture, and the like.

The package 15 has a base 16 and a lid 17. Specifically, the package 15 includes the base 16 that supports the vibrator 10 and the integrated circuit device 20, and the lid 17 that is bonded to the upper surface of the base 16 so as to form a housing space between the lid 17 and the base 16. Then, the vibrator 10 is supported by the step-difference portion provided inside the base 16 via the terminal electrode. The integrated circuit device 20 is disposed at the inner bottom surface of the base 16. Specifically, the integrated circuit device 20 is disposed such that the active surface faces the inner bottom surface of the base 16. The active surface is a surface on which circuit elements of the integrated circuit device 20 are formed. Further, bumps BMP are formed on the pad of the integrated circuit device 20. The integrated circuit device 20 is supported at the inner bottom surface of the base 16 via the conductive bumps BMP. The conductive bump BMP is, for example, a metal bump, and the vibrator 10 and the integrated circuit device 20 are electrically coupled via the bump BMP, the internal wiring of the package 15, the terminal electrode, and the like. The integrated circuit device 20 is electrically coupled to the external terminals 18 and 19 of the oscillator 4 via the bump BMP and the internal wiring of the package 15.

The external terminals 18 and 19 are formed at the outer bottom surface of the package 15. The external terminals 18 and 19 are coupled to an external device via external wiring. The external wiring is, for example, wiring formed on a circuit substrate on which an external device is mounted. As a result, a clock signal or the like can be output to the external device.

In FIG. 20, the integrated circuit device 20 is flip-mounted so that the active surface of the integrated circuit device 20 faces downward, but the present embodiment is not limited to such mounting. For example, the integrated circuit device 20 may be mounted so that the active surface of the integrated circuit device 20 faces upward. That is, the integrated circuit device 20 is mounted so that the active surface faces the vibrator 10.

Figure 21:
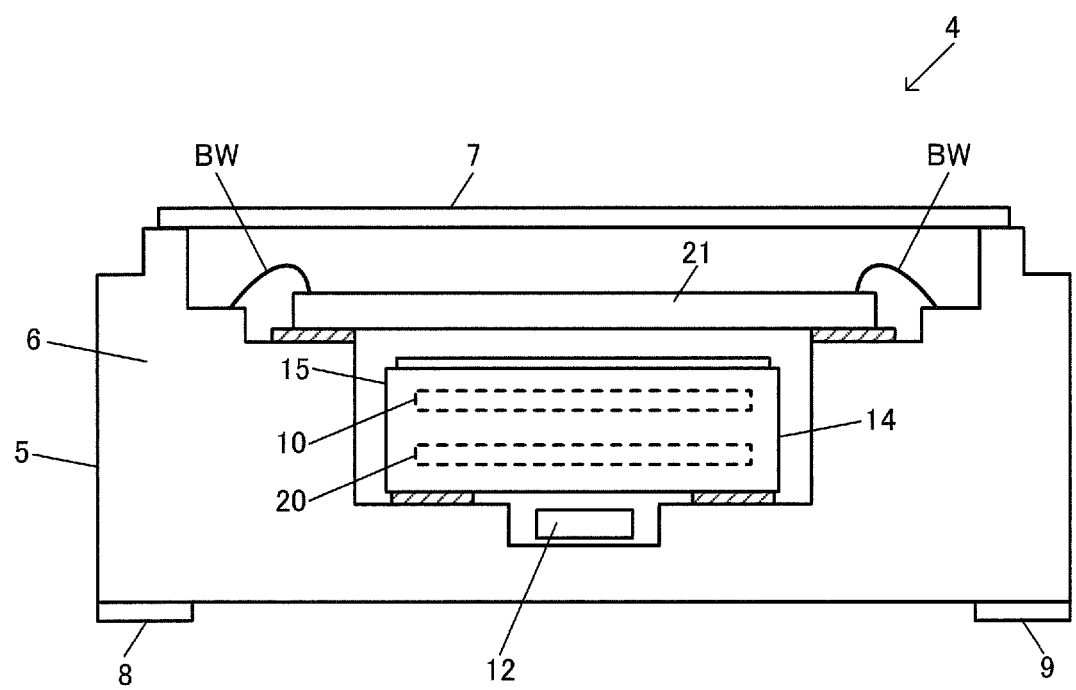
FIG. 21 is a second structural example of the oscillator.

FIG. 21 shows a second structural example of the oscillator 4. The oscillator 4 in FIG. 21 includes the vibrator 10, the integrated circuit device 20, and an integrated circuit device 21. The oscillator 4 includes the package 15 that houses the vibrator 10 and the integrated circuit device 20, and a package 5 that houses the package 15 and the integrated circuit device 21. The package 15 and the package 5 are a first package and a second package, respectively. The first package and the second package can also be referred to as a first container and a second container.

In the present embodiment, the integrated circuit device 20 housed in the package 15 performs the first temperature compensation process, and the integrated circuit device 21 housed in the package 5 performs the second temperature compensation process. For example, the vibrator 10 and the integrated circuit device 20 are housed in the package 15, thereby configuring a temperature compensation type oscillator 14 that performs, for example, an analog first temperature compensation process. The oscillator 4 that generate a highly accurate clock signal is configured of the oscillator 14 that performs the analog first temperature compensation process and the integrated circuit device 21 that performs the digital second temperature compensation process are housed in the package 5. The integrated circuit device 21 can also be called a correction IC that performs a second temperature compensation process of fine adjustment in a digital manner.

Specifically, the package 5 is formed of, for example, ceramic or the like, and has a housing space inside. In this housing space, the oscillator 14 in which the vibrator 10 and the integrated circuit device 20 are housed in the package 15 and the integrated circuit device 21 are housed. The housing space is hermetically sealed and is preferably in a reduced pressure state that is close to a vacuum. The package 5 can suitably protect the integrated circuit device 21 and the oscillator 14 from impact, dust, heat, moisture, and the like.

The package 5 has the base 6 and the lid 7. Specifically, the package 5 includes the base 6 that supports the oscillator 14 and the integrated circuit device 21, and the lid 7 that is bonded to the upper surface of the base 6 so as to form a housing space between the lid 7 and the base 6. The base 6 has, at the inside thereof, a first recess opening on the top surface and a second recess opening on the bottom surface of the first recess. The integrated circuit device 21 is supported on the bottom surface of the first recess. For example, the integrated circuit device 21 is supported by a step-difference portion on the bottom surface via a terminal electrode. The oscillator 14 is supported on the bottom surface of the second recess. For example, the oscillator 14 is supported by a step-difference portion on the bottom surface via a terminal electrode. The base 6 has a third recess opening in the bottom surface of the second recess, and the circuit component 12 is disposed in the third recess. For example, a capacitor or a temperature sensor can be assumed as the circuit component 12 to be disposed.

The integrated circuit device 21 is electrically coupled to the terminal of the oscillator 14 via, for example, a bonding wire BW, a terminal electrode formed on a step-difference portion, or an internal wiring of the package 5. As a result, the clock signal and temperature detection signal from the oscillator 14 can be input to the integrated circuit device 21. Further, the integrated circuit device 21 is electrically coupled to external terminals 8 and 9 of the oscillator 4 via the bonding wire BW, the terminal electrode formed in the step-difference portion, and the internal wiring of the package 5. The external terminals 8 and 9 are formed on the outer bottom surface of the package 5. The external terminals 8 and 9 are coupled to an external device via external wiring. The external wiring is, for example, wiring formed on a circuit substrate on which an external device is mounted. As a result, a clock signal or the like can be output to the external device. The terminal of the oscillator 14 and the external terminals 8 and 9 may be electrically coupled.

In FIG. 21, the integrated circuit device 21 is disposed above the oscillator 14, but the integrated circuit device 21 may be disposed below the oscillator 14. Here, the upward direction is the direction from the bottom surface of the package 5 toward the lid 7, and the downward direction is the opposite direction. The integrated circuit device 21 may be provided on the side of the oscillator 14. That is, the oscillator 14 and the integrated circuit device 21 are disposed side by side in a top view of the oscillator 4.

Next, the integrated circuit device 21 will be described. The integrated circuit device 21 includes a clock signal generation circuit to which a first clock signal that is a clock signal generated by the oscillator 14 is input as a reference clock signal. Then, the clock signal generated by the clock signal generation circuit is output to the outside as the output clock signal of the oscillator 4. For example, the clock signal generation circuit of the integrated circuit device 21 is configured by a fractional-N type PLL circuit to which the first clock signal from the oscillator 14 is input as a reference clock signal. This PLL circuit compares the phase of a reference clock signal, which is a first clock signal, and a feedback clock signal obtained by dividing the output clock signal of the PLL circuit by a frequency dividing circuit. The fractional-N type PLL circuit is realized by setting a fractional division ratio using a delta-sigma modulation circuit. Further, the control circuit included in the integrated circuit device 21 performs the correction process of the frequency division ratio data set in the PLL circuit based on the temperature compensation data, thereby realizing the second temperature compensation process. The first temperature compensation process performed in the oscillator 14 is realized by a temperature compensation process based on polynomial approximation, for example. Further, the clock signal generation circuit may be constituted by a direct digital synthesizer. In this case, the second temperature compensation process is realized by inputting the frequency control data corrected by the temperature compensation data to the direct digital synthesizer that operates using the first clock signal as the reference clock signal.

According to the oscillator 4 shown in FIG. 21, the integrated circuit device 20 that oscillates the vibrator 10 performs the first temperature compensation process, so that the amount of frequency fluctuation in the frequency-temperature characteristics of the first clock signal output from the integrated circuit device 20, which is the first integrated circuit device, can be reduced. The integrated circuit device 21 that is the second integrated circuit device performs the second temperature compensation process when generating the clock signal based on the first clock signal from the integrated circuit device 20. After the first temperature compensation process is performed by the integrated circuit device 20 as described above, the second temperature compensation process is performed by the integrated circuit device 21, thereby it becomes possible to reduce the micro jump of the frequency due to the fluctuation of the temperature measurement result and the like, and to achieve the high accuracy and the like of the clock frequency of the oscillator 4. In addition, the oscillator 4 of FIG. 21 may perform the first temperature compensation process using the temperature sensor provided in the integrated circuit device 20 and the temperature detection signal of the temperature sensor may be output from the integrated circuit device 20 and input to the integrated circuit device 21. Then, the integrated circuit device 21 may perform the second temperature compensation process based on the input temperature detection signal. In this case, the first temperature compensation process in the integrated circuit device 20 and the second temperature compensation process in the integrated circuit device 21 can be performed based on the temperature detection signal from the same temperature sensor. Thus, more appropriate temperature compensation processing can be realized. In this case, the distance between the temperature sensor incorporated in the integrated circuit device 20 and the vibrator 10 is shorter than the distance between the temperature sensor and the integrated circuit device 21. Therefore, by performing the digital temperature compensation process, the distance between the integrated circuit device 21 that generates a large amount of heat and the vibrator 10 can be increased, and it is possible to reduce the adverse affect of the heat generated by the integrated circuit device 21 on the temperature detection result of the temperature sensor. Therefore, the temperature of the vibrator 10 can be measured more accurately using the temperature sensor incorporated in the integrated circuit device 20.

7. Electronic Apparatus and Vehicle

Figure 22:
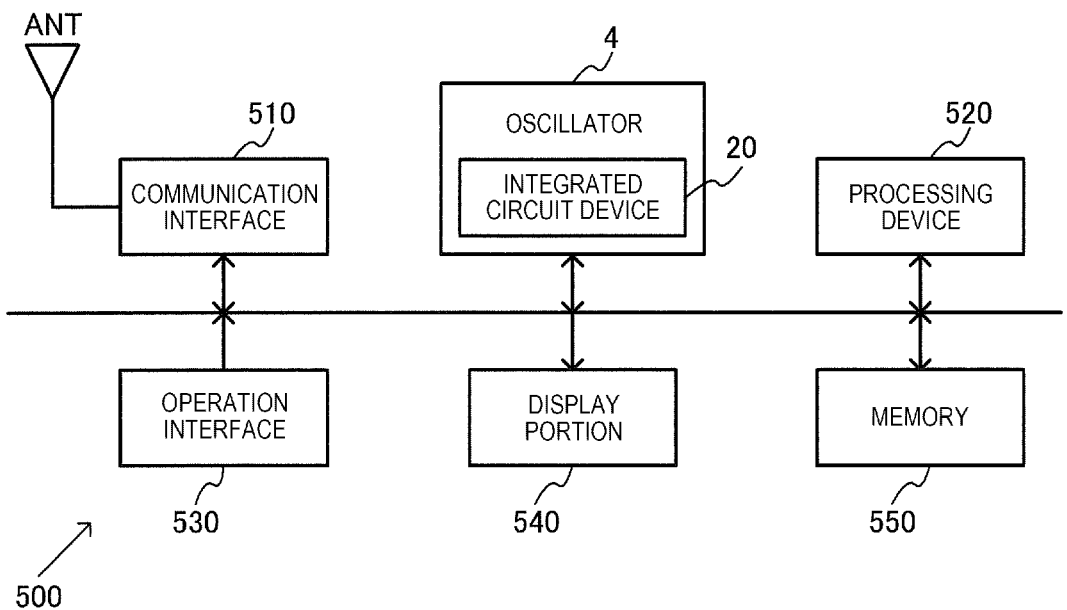
FIG. 22 is a configuration example of an electronic apparatus.

FIG. 22 shows a configuration example of an electronic apparatus 500 including the integrated circuit device 20 of the present embodiment. The electronic apparatus 500 includes the integrated circuit device 20 of the present embodiment and a processing device 520 that performs processing based on an output signal of the integrated circuit device 20. Here, the output signal is, for example, a clock signal generated by the integrated circuit device 20 based on the oscillation signal of the oscillation circuit 30. Specifically, the electronic apparatus 500 includes the oscillator 4 having the integrated circuit device 20 of the present embodiment, and the processing device 520 operates based on a clock signal from the oscillator 4 to perform various processes. The electronic apparatus 500 can include an antenna ANT, a communication interface 510, an operation interface 530, a display portion 540, and a memory 550. The electronic apparatus 500 is not limited to the configuration shown in FIG. 22, and various modifications can be made such as omitting some of these components or adding other components.

The electronic apparatus 500 is, for example, a network-related device such as a base station or a router, a high-precision measuring device for measuring physical quantities such as distance, time, flow velocity or flow rate, a biological information measuring device for measuring biological information, or an in-vehicle device. The biological information measurement device is, for example, an ultrasonic measurement device, a pulse wave meter, a blood pressure measurement device, or the like. The in-vehicle device is a device for automatic driving. The electronic apparatus 500 may be a wearable device such as a head-mounted display device or a clock-related device, a robot, a printing device, a projection device, a mobile information terminal such as a smartphone, a content providing device that distributes content, or a video device such as a digital camera or video camera.

As the electronic apparatus 500, there is a device used for a next-generation mobile communication system such as 5G. For example, the integrated circuit device 20 of the present embodiment can be used in various devices such as a base station, a remote radio head (RRH), or a mobile communication terminal of a next generation mobile communication system. In a next-generation mobile communication system, a high-accuracy clock frequency is required for time synchronization and the like, which is suitable as an application example of the integrated circuit device 20 of the present embodiment that can generate a high-accuracy clock signal.

The communication interface 510 performs a process of receiving data from the outside via the antenna ANT or transmitting data to the outside. The processing device 520 that is a processor performs a control process of the electronic apparatus 500 and various digital processes of data transmitted and received via the communication interface 510. The function of the processing device 520 can be realized by a processor such as a microcomputer. The operation interface 530 is for a user to perform an input operation, and can be realized by an operation button, a touch panel display, or the like. The display portion 540 displays various types of information and can be realized by a display such as a liquid crystal or an organic EL. The memory 550 stores data, and the function can be realized by a semiconductor memory such as a RAM or a ROM.

Figure 23:
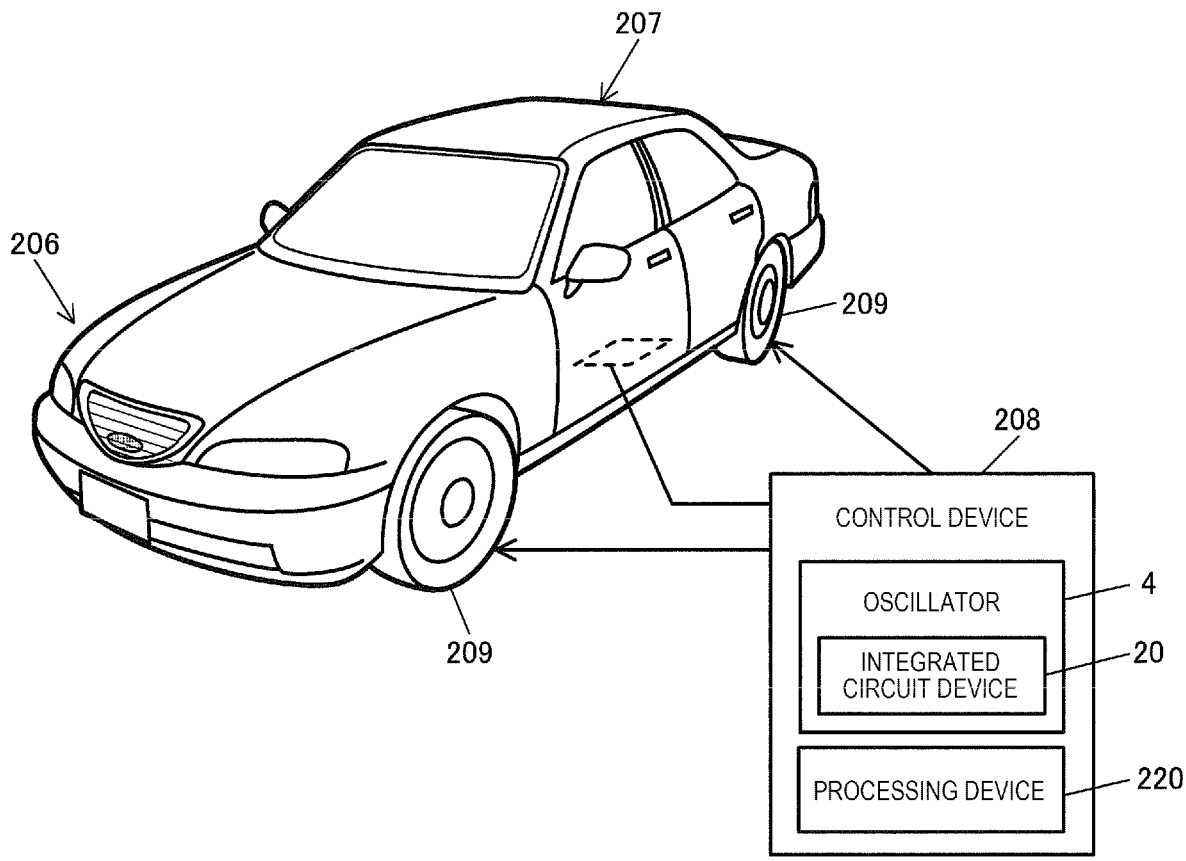
FIG. 23 is a configuration example of a vehicle.

FIG. 23 shows an example of a vehicle including the integrated circuit device 20 of the present embodiment. The vehicle includes the integrated circuit device 20 of the present embodiment and a processing device 220 that performs processing based on an output signal of the integrated circuit device 20. Here, the output signal is, for example, a clock signal generated by the integrated circuit device 20 based on the oscillation signal of the oscillation circuit 30. Specifically, the vehicle includes the oscillator 4 having the integrated circuit device 20 of the present embodiment, and the processing device 220 operates based on a clock signal from the oscillator 4 to perform various processes. The integrated circuit device 20 of the present embodiment can be incorporated into various vehicles such as a car, an airplane, a motorcycle, a bicycle, or a ship. The vehicle is a device or an apparatus that includes a drive mechanism such as an engine or a motor, a steering mechanism such as a steering wheel or a rudder, and various electronic apparatuses, and moves on the ground, the sky, or the sea. FIG. 23 schematically shows an automobile 206 as a specific example of a vehicle. The integrated circuit device 20 of the present embodiment is incorporated in the automobile 206. Specifically, the automobile 206 which is a vehicle includes a control device 208, and the control device 208 includes the oscillator 4 including the integrated circuit device 20 of the present embodiment and the processing device 220 which operates based on the clock signal generated by the oscillator 4. For example, the control device 208 controls the hardness of the suspension according to the posture of the vehicle body 207 and controls the brakes of the individual wheels 209. For example, automatic driving of the automobile 206 may be realized by the control device 208. The device in which the integrated circuit device 20 of the present embodiment is incorporated is not limited to such the control device 208, and can be incorporated in various in-vehicle devices such as a meter panel device and a navigation device provided in a vehicle such as the automobile 206.

As described above, the integrated circuit device of the present embodiment includes the temperature sensor, the heat generation source circuit serving as the heat generation source, the pad for external coupling, and a capacitor having the MIM structure in which one electrode is electrically coupled to the pad for external coupling. In a plan view orthogonal to the substrate on which the circuit element is formed, the capacitor having the MIM structure and the temperature sensor overlap.

According to the present embodiment, the capacitor having the MIM structure is disposed so as to overlap the temperature sensor in a plan view orthogonal to the substrate of the integrated circuit device. Then, one electrode of the capacitor having the MIM structure is electrically coupled to a pad for external coupling. By disposing the capacitor having the MIM structure so as to overlap the temperature sensor in a plan view, it is possible to suppress the heat from the heat generation source circuit from being transmitted to the temperature sensor. Since the heat from the heat generation source circuit can be dissipated to the outside via the pad for external coupling, the adverse effect due to the heat transmission from the heat generation source circuit can be reduced. Further, since the capacitor having the MIM structure can be disposed by effectively utilizing the disposal region of the temperature sensor, the area of the integrated circuit device can be reduced. Therefore, it is possible to provide an integrated circuit device that can achieve both the reduction of the adverse effect of heat from the heat generation source circuit and the reduction of the area.

In the integrated circuit device of the present embodiment, the temperature sensor may be disposed at a corner portion where two sides of the integrated circuit device intersect.

By disposing the temperature sensor at the corner portion in this manner, the distance between the heat generation source circuit and the temperature sensor disposed in the integrated circuit device can be increased, and so that it is possible to suppress the heat from the heat generation source circuit from adversely affecting the temperature detection result of the temperature sensor.

In the integrated circuit device of the present embodiment, the temperature sensor may be disposed along the first side of the integrated circuit device, and the heat generation source circuit may be disposed along the second side intersecting the first side of the integrated circuit device.

When the temperature sensor is disposed along the first side of the integrated circuit device and the heat generation source circuit is disposed along the second side, the distance between the temperature sensor and the heat generation source circuit can be increased. Therefore, it is possible to suppress the heat from the heat generation source circuit from adversely affecting the temperature detection result.

In the integrated circuit device of the present embodiment, the pad for external coupling may be a ground pad or a power supply pad.

In this way, a capacitor having the MIM structure in which a ground voltage or a power supply voltage is supplied to one of the electrodes can be disposed by effectively utilizing the disposal region of the temperature sensor.

In the integrated circuit device of the present embodiment, the pad for external coupling is a ground pad, and a ground voltage may be supplied from the ground pad to one electrode of the capacitor having the MIM structure, a power supply voltage from a power supply pad, a voltage generated from the power supply voltage, or a temperature detection voltage of a temperature sensor may be supplied to the other electrode of the capacitor having the MIM structure.

In this manner, the capacitor having the MIM structure formed in the region where the temperature sensor is disposed can be used as a capacitor for stabilizing the potential of the power supply voltage, the voltage generated by the power supply voltage, or the temperature detection voltage.

In the integrated circuit device of the present embodiment, the voltage generated from the power supply voltage is applied to the other electrode of the capacitor having the MIM structure, and the voltage generated from the power supply voltage may be a regulated voltage generated by a regulator to which a power supply voltage is supplied or a reference voltage generated by a reference voltage generation circuit to which a power supply voltage is supplied.

In this way, the capacitor having the MIM structure formed in the temperature sensor disposal region can be used as a capacitor for stabilizing the potential of the regulated voltage or the reference voltage.

In the integrated circuit device of the present embodiment, the pad for external coupling is a ground pad, and one electrode of the capacitor having the MIM structure may be electrically coupled to the ground pad via a ground line, the ground line may be electrically coupled to the substrate via a metal plug, and the metal plug may be disposed between the temperature sensor and the heat generation source circuit in a plan view.

In this way, the heat from the heat generation source circuit is transmitted to the ground line via a plurality of metal plugs arranged between the temperature sensor and the heat generation source circuit, and is dissipated to the outside via the ground pad.

In the integrated circuit device of the present embodiment, the temperature sensor includes a bipolar transistor and a resistor, and the capacitor having the MIM structure and the bipolar transistor may overlap in a plan view.

In this way, the transmission of heat from the heat generation source circuit to the bipolar transistor is suppressed, and the adverse effect of heat on the temperature detection voltage of the temperature sensor can be suppressed.

In the integrated circuit device of the present embodiment, the oscillation circuit that generates the oscillation signal by oscillating the vibrator and the output circuit that buffers the oscillation signal from the oscillation circuit and outputs the clock signal are provided. Also, the heat generation source circuit may be an output circuit.

In this way, it is possible to prevent the heat from the output circuit, which is the heat generation source circuit, from having an adverse effect on the result of temperature detection by the temperature sensor and the performance deterioration of the clock signal due to the fluctuation of the temperature detection voltage can be reduced.

The integrated circuit device of the present embodiment includes a first pad electrically coupled to one end of the vibrator, and a second pad electrically coupled to the other end of the vibrator. The distance between the temperature sensor and the first pad may be shorter than the distance between the temperature sensor and the output circuit.

In this manner, the distance between the first pad electrically coupled to one end of the vibrator and the temperature sensor can be reduced, and the temperature of the vibrator can be more appropriately detected using the temperature sensor. Further, by increasing the distance between the temperature sensor and the output circuit, it is possible to suppress the heat from the output circuit from adversely affecting the temperature detection result of the temperature sensor.

The integrated circuit device of the present embodiment includes an oscillation circuit that generates an oscillation signal by oscillating a vibrator, an output circuit that buffers an oscillation signal from the oscillation circuit and outputs a clock signal, a first pad electrically coupled to one end of the vibrator, and a second pad electrically coupled to the other end of the vibrator, the heat generation source circuit is an output circuit, and the temperature sensor, the first pad, and the second pad may be disposed along a first side of the integrated circuit device, and the output circuit may be disposed along a second side intersecting the first side of the integrated circuit device.

By disposing the temperature sensor, the first pad and the second pad along the first side of the integrated circuit device, the distance between the temperature sensor and the first and second pads can be reduced, and the temperature of the vibrator can be more appropriately detected using the temperature sensor. Further, by disposing the output circuit along the second side of the integrated circuit device, the distance between the temperature sensor and the output circuit can be increased, and it is possible to suppress the heat from the output circuit from adversely affecting the temperature detection result of the temperature sensor.

The integrated circuit device according to the present embodiment has a temperature sensor, a heat generation source circuit serving as a heat generation source, a pad for external coupling serving as a ground pad or a power supply pad, and a capacitor having the MIM structure in which one electrode is electrically coupled to the pad for external coupling. In a plan view orthogonal to the substrate on which the circuit element is formed, the capacitor having the MIM structure and the heat generation source circuit overlap.

According to the present embodiment, the capacitor having the MIM structure is disposed so as to overlap the heat generation source circuit in a plan view orthogonal to the substrate of the integrated circuit device. One electrode of the capacitor having the MIM structure is electrically coupled to a ground pad or a power supply pad which is a pad for external coupling. By disposing the capacitor having an MIM structure so as to overlap with the heat generation source circuit in a plan view, heat from the heat generation source circuit is insulated by the capacitor having the MIM structure provided in the heat generation source circuit disposal region, and thereby, transmission of the heat to the temperature sensor is suppressed. Since the heat from the heat generation source circuit can be dissipated to the outside through the ground pad or the power supply pad, which is a pad for external coupling, the adverse effect due to the heat transmission from the heat generation source circuit can be reduced. Further, since the capacitor having the MIM structure can be disposed by effectively utilizing the disposal region of the heat generation source circuit, the area of the integrated circuit device can be reduced. Therefore, it is possible to provide an integrated circuit device that can achieve both the reduction of the adverse effect of heat from the heat generation source circuit and the reduction of the area.

The present embodiment also relates to an oscillator including the integrated circuit device described above and a vibrator.

The present embodiment also relates to an electronic apparatus including the above-described integrated circuit device and a processing device that performs processing based on an output signal from the integrated circuit device.

The present embodiment also relates to a vehicle including the integrated circuit device described above and a processing device that performs processing based on an output signal from the integrated circuit device.

Although the present embodiment has been described in detail as described above, it will be easily understood by those skilled in the art that many modifications can be made without departing from the novel matter and effects of the present disclosure. Accordingly, all such modifications are intended to be included within the scope of the present disclosure. For example, a term described at least once together with a different term having a broader meaning or the same meaning in the specification or the drawings can be replaced with the different term anywhere in the specification or the drawings. All combinations of the present embodiment and the modified examples are also included in the scope of the present disclosure. Further, the configuration and operation of the integrated circuit device, the oscillator, the electronic apparatus, and the vehicle are not limited to those described in the present embodiment, and various modifications can be made.

What is claimed is:

1. An integrated circuit device comprising:
   a temperature sensor;
   a heat generation source circuit serving as a heat generation source;
   a pad for external coupling; and
   a capacitor having a metal-insulator-metal (MIM) structure in which one electrode is electrically coupled to the pad for external coupling, wherein
   the capacitor having the MIM structure and the temperature sensor overlap in a plan view orthogonal to a substrate on which a circuit element is formed.

2. The integrated circuit device according to claim 1, wherein
   the temperature sensor is disposed at a corner portion where two sides of the integrated circuit device intersect.

3. The integrated circuit device according to claim 1, wherein
   the temperature sensor is disposed along a first side of the integrated circuit device, and
   the heat generation source circuit is disposed along a second side intersecting the first side of the integrated circuit device.

4. The integrated circuit device according to claim 1, wherein
   the pad for external coupling is a ground pad or a power supply pad.

5. The integrated circuit device according claim 1, wherein
   the pad for external coupling is a ground pad,
   a ground voltage is supplied from the ground pad to the one electrode of the capacitor having the MIM structure, and
   a power supply voltage from a power supply pad, a voltage generated from the power supply voltage, or a temperature detection voltage of the temperature sensor is supplied to the other electrode of the capacitor having the MIM structure.

6. The integrated circuit device according to claim 5, wherein
   the voltage generated from the power supply voltage is applied to the other electrode of the capacitor having the MIM structure, and
   the voltage generated from the power supply voltage is a regulated voltage generated by a regulator to which the power supply voltage is supplied, or a reference voltage generated by a reference voltage generation circuit to which the power supply voltage is supplied.

7. The integrated circuit device according to claim 1, wherein
   the pad for external coupling is a ground pad,
   the one electrode of the capacitor having the MIM structure is electrically coupled to a ground pad via a ground line,
   the ground line is electrically coupled to the substrate via a metal plug, and
   the metal plug is disposed between the temperature sensor and the heat generation source circuit in the plan view.

8. The integrated circuit device according to claim 1, wherein
   the temperature sensor includes a bipolar transistor and a resistor, and
   the capacitor having the MIM structure and the bipolar transistor overlap in the plan view.

9. The integrated circuit device according to claim 1, further comprising:
   an oscillation circuit that generates an oscillation signal by oscillating a vibrator; and
   an output circuit that buffers the oscillation signal from the oscillation circuit and outputs a clock signal, wherein
   the heat generation source circuit is the output circuit.

10. The integrated circuit device according to claim 9, further comprising:
    a first pad electrically coupled to one end of the vibrator; and
    a second pad electrically coupled to the other end of the vibrator, wherein
    a distance between the temperature sensor and the first pad is shorter than a distance between the temperature sensor and the output circuit.

11. The integrated circuit device according to claim 1, further comprising:
    an oscillation circuit that generates an oscillation signal by oscillating a vibrator;
    an output circuit that buffers the oscillation signal from the oscillation circuit and outputs a clock signal;
    a first pad electrically coupled to one end of the vibrator; and
    a second pad electrically coupled to the other end of the vibrator, wherein
    the heat generation source circuit is the output circuit,
    the temperature sensor, the first pad, and the second pad are disposed along a first side of the integrated circuit device, and
    the output circuit is disposed along a second side of the integrated circuit device that intersects the first side.

12. An integrated circuit device comprising:
    a temperature sensor;
    a heat generation source circuit serving as a heat generation source;
    a pad for external coupling which is a ground pad or a power supply pad; and a capacitor having a metal-insulator-metal (MIM) structure in which one electrode is electrically coupled to the pad for external coupling, wherein the capacitor having the MIM structure and the heat generation source circuit overlap in a plan view orthogonal to a substrate on which a circuit element is formed.

13. An oscillator comprising:

the integrated circuit device according to claim 9; and the vibrator.

14. An electronic apparatus comprising:

the integrated circuit device according to claim 1; and a processing device that performs processing based on an output signal from the integrated circuit device.

15. A vehicle comprising:

the integrated circuit device according to claim 1; and a processing device that performs processing based on an output signal from the integrated circuit device.

\* \* \* \* \*